United States Patent
Tamir et al.

(10) Patent No.: US 10,673,459 B1
(45) Date of Patent: *Jun. 2, 2020

(54) SYSTEM AND COMPONENTS FOR ENCODING INTEGERS

(71) Applicant: iDensify LLC, Round Rock, TX (US)

(72) Inventors: Dan E. Tamir, Round Rock, TX (US); Dan Bruck, Austin, TX (US)

(73) Assignee: iDensify LLC, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/410,422

(22) Filed: May 13, 2019

Related U.S. Application Data

(63) Continuation of application No. 15/915,712, filed on Mar. 8, 2018, now Pat. No. 10,333,549.

(60) Provisional application No. 62/468,770, filed on Mar. 8, 2017, provisional application No. 62/529,688, filed on Jul. 7, 2017.

(51) Int. Cl.
*H03M 7/30* (2006.01)
*H03M 7/42* (2006.01)

(52) U.S. Cl.
CPC ........... *H03M 7/3088* (2013.01); *H03M 7/42* (2013.01); *H03M 7/6005* (2013.01); *H03M 7/6011* (2013.01); *H03M 7/6052* (2013.01); *H03M 7/6017* (2013.01)

(58) Field of Classification Search
CPC .... H03M 7/3088; H03M 7/42; H03M 7/6005; H03M 7/6011; H03M 7/6052

USPC .......................................................... 341/106
See application file for complete search history.

(56) References Cited

U.S. PATENT DOCUMENTS

| | | | | |
|---|---|---|---|---|
| 5,026,156 A * | 6/1991 | Bayston | ................... | F41G 7/226 342/13 |
| 5,579,430 A * | 11/1996 | Grill | ...................... | H03M 7/42 704/203 |
| 6,347,122 B1 * | 2/2002 | Chen | ...................... | H04L 1/0059 375/262 |
| 6,826,137 B1 * | 11/2004 | Lee | ....................... | G11B 19/122 369/47.12 |
| 8,166,042 B1 * | 4/2012 | Praun | ...................... | G06F 16/29 707/743 |
| 10,333,549 B1 * | 6/2019 | Tamir | ................... | H03M 7/3088 |
| 2006/0267810 A1 * | 11/2006 | Widmer | .................. | H03M 7/04 341/51 |
| 2008/0128625 A1 * | 6/2008 | Lamadie | ................. | G01T 1/295 250/361 R |
| 2010/0172428 A1 * | 7/2010 | Pani | ...................... | H04L 1/0026 375/262 |
| 2014/0085314 A1 * | 3/2014 | Steinke | ..................... | G06F 3/14 345/473 |
| 2014/0210652 A1 * | 7/2014 | Bartnik | ................... | H03M 7/40 341/67 |

* cited by examiner

*Primary Examiner* — Lam T Mai
(74) *Attorney, Agent, or Firm* — Lee & Hayes, P.C.

(57) ABSTRACT

A system for encoding and decoding data-tokens. In some examples, the system may be configured to encode and decode integers. In other cases, the system may be configured to encode and decode symbols or bytes of data.

20 Claims, 24 Drawing Sheets

1400

| Current state | Output | Action | | Next state | |
|---|---|---|---|---|---|
| IDLE 1402 | ready | Read a byte from source to byte register | !Byte Valid | IDLE | |
| | | | Byte Valid | CAM1 | |
| CAM1 1404 | | Compare byte to table | !Hit | TXEXC | |
| | | | Hit | TYPOFHIT | |
| TXEXC 1406 | Tx-exc+byte | Transmit exception code + byte | | IDLE | |
| | | Update Table 1 | | IDLE | |
| TYPOFHIT 1408 | UpdtTbl | Update Table 2 (current read byte is in the table) | !CplHead | TX1 | |
| | | | CplHead | RDBYTE | |
| RDBYTE 1410 | ready | Read second byte from source to byte register | !Byte Valid | TX2 | End of data |
| | | | Byte Valid | CAM2 | |
| CAM2 1412 | | Compare second byte to table | !Hit | TX3 | |
| | | | Hit | ISLEGCPL | |
| TX1 1414 | | Transmit code (singleton in the table) | | IDLE | |
| | | | | IDLE | |
| TX2 1416 | | Transmit code (singleton was privileged and no data after it) | | IDLE | |
| | | | | IDLE | |
| ISLEGCPL 1418 | | CHECK FOR VALID PAIR | !VALID | TX4 | |
| | | | VALID | TXCPL | |
| TXCPL 1420 | | TRANSMIT PAIR CODE | | IDLE | |
| | | Update Table 2 (second byte) | | IDLE | |
| TX3 1422 | | Transmit first byte as singleton | | TXEXC | |
| | | | | TXEXC | |
| TX4 1424 | | Transmit first byte as singleton | | TX5 | |
| | | Update Table 2 (second byte) | | TX5 | |
| TX5 1426 | | Transmit second byte as singleton | | IDLE | |
| | | | | IDLE | |

FIG. 14

SYSTEM AND COMPONENTS FOR ENCODING INTEGERS

This application is a continuation of and claims priority to U.S. application Ser. No. 15/915,712, filed on Mar. 8, 2018 and entitled "System and Encoding and Decoding System," which is a non-provisional of and claims priority to U.S. Provisional Application No. 62/468,770 filed on Mar. 8, 2017 and entitled "BOUNDED-INTEGER ENCODING AND DECODING SYSTEM," and U.S. Provisional Application No. 62/529,688 filed on Jul. 7, 2017 and entitled "LOSSLESS ENCODING AND DECODING SYSTEMS," the entirety of which are incorporated herein by reference.

BACKGROUND

Lossless data compression is essential for numerous types of systems including communication, multimedia, information retrieval, storage, inter chip and intra chip Communication, and computer networks. In some situations, lossless data compression may be utilized to reduce data transmission bandwidth and/or the memory required to store and manage data in computer systems. Conventional approaches to lossless data compression are either computationally expensive or fail to produce high compression ratio along with high throughput at low latency.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical components or features.

FIG. 14 is an example state machine table showing an illustrative process for encoding symbols according to some implementation.

DETAILED DESCRIPTION

Figure 1:
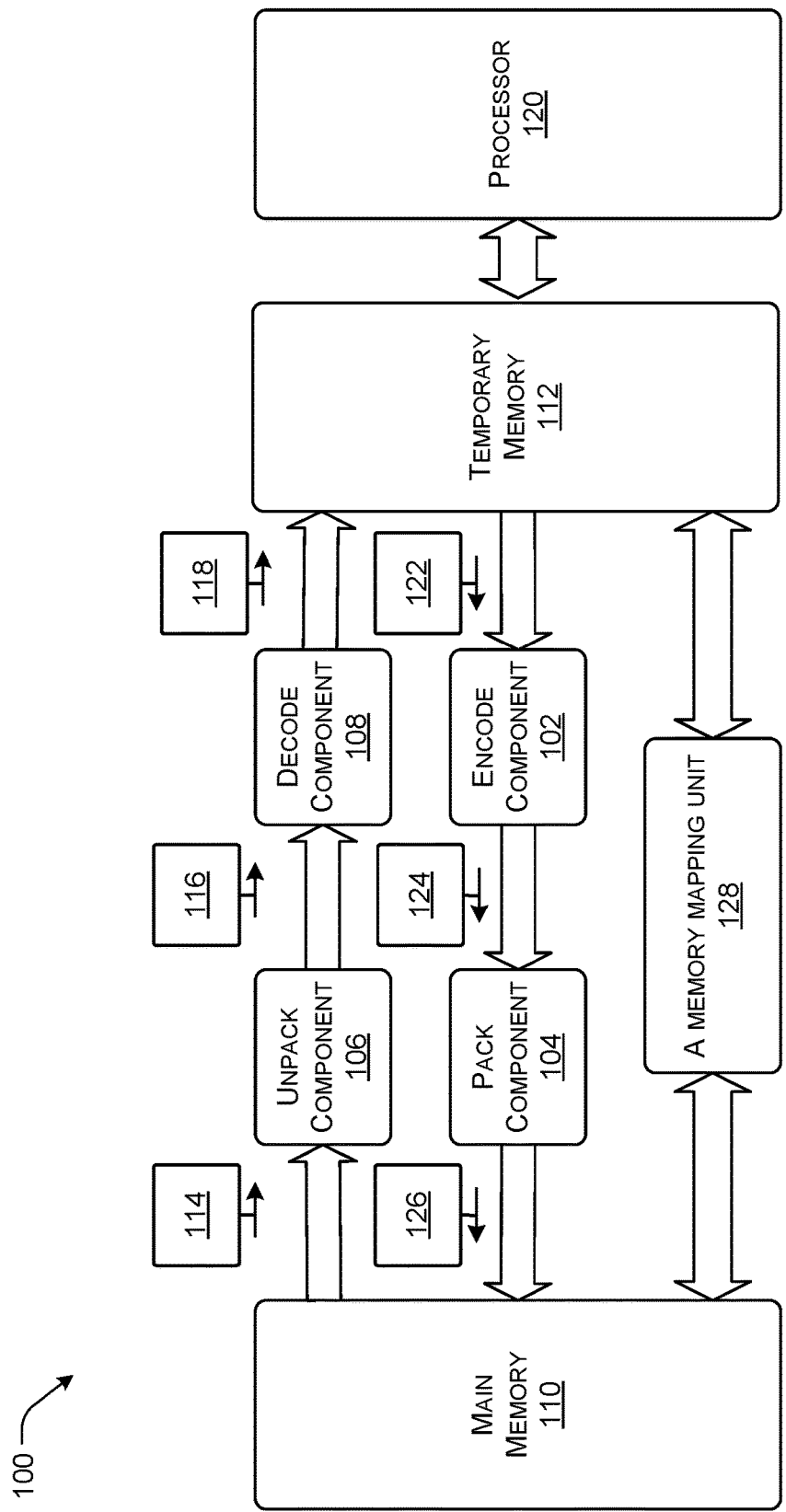
FIG. 1 illustrates a block diagram showing select components of an example encoding, decoding, packing, and unpacking system according to some implementations.

Described herein are systems for providing lossless data-tokens encoding and decoding of data-tokens code at high compression, high throughput, low latency, low energy consumption, and low implementation costs. The systems may include an encoding component and a pack component that are configured to convert data-tokens into an encoded and packed representation. Additionally, the systems may be configured to unpack packed code and decode it. In various examples below, techniques and system for encoding and decoding of two types of data, symbols and integer values, are discussed. In the implementations utilizing symbols, the symbols are assumed to be members of an alphabet (set of characters). For example, the symbols may be members of the English alphabet set of characters. That is each character from a to z and from A to Z is considered as a symbol. Other examples of symbols, include all the members of the ASCII set of characters or all the members of the Unicode set of characters. Since dealing with bytes provides for efficient hardware implementation and without limiting the generality, each distinct byte may represent a symbol in a set of symbols that contains all the combinations of eight-bits. Hence, there are 256 symbols in this alphabet, each of which, is represented by a unique combination of eight-bits. Thus, in some cases, data-tokens may be referred to as symbols. In these cases, the data may be a stream of symbols (e.g., a stream of bytes).

For example, the encoding component may be configured to receive data-tokens as symbol, values generally represented as one eight-bit byte or integer values represented in eight-bit scheme, sixteen-bit scheme, thirty-two-bit scheme, sixty-four-bit scheme, or other schemes such as one hundred and twenty-eight-bit schemes. The encoding component may convert the data-token into an encoded representation based on the scheme used. In some cases, however, the data-token may be composed of highly auto-correlated integer sequences.

The second type of data is referred to herein as integers. As described herein, the term 'integer' refer to members of a set or a stream of data elements that represents numbers, indexes, measurements, etc. Moreover, often these data elements have high auto-correlation. In this case, more knowledge of the data (e.g., the nature of correlation between consecutive integers) might be available and may be exploited to improve compression. For example, a sensor might emit a set of numbers that are the results of measurements of the temperature in a specific location in a power plant. Each of these measurements might be represented by sixteen-bits and may be referred to as sixteen-bit 'integer'. Thus, as used herein, the term data-token may represent both symbols and integers. Otherwise, the terms symbols and integers are used as appropriate for specific encoders and decoders.

In a first example discussed herein, SIGBITS compression technique may be used to compress and decompress positive integers (i.e., integers that are greater than zero) constrained to thirty-two bits (i.e., values of less than 4294967296 may be encoded as follows. For example, a thirty-two-bit integer i may have a binary representation of $\beta_i$ with 0 or more bits prepended to the left of $\beta_i$. Each $\beta_i$ includes a most significant bit (MSB) with the value of "1". This bit is the left most bit of "1" and is referred to herein as the "leading-1" or LO in $\beta_i$. Each bit to the right of the LO may be considered as the frustum, I. Thus, the frustum for an integer i (e.g., $I_i$) may be obtained from i by truncating the fixed length code binary representation of i starting with the LO of $\beta_i$ and each of the bits to the left of the LO of $\beta_i$. For instance, in one specific example, if we set i=9, then the thirty-two-bit representation of i is '00000000000000000000000000001001, In this case, $\beta_i$ is equal to "1001." Thus, $I_i$ is equal to "001". Further, let $P_i$ be a fixed length header (FLH) representing the position of the LO of $\beta_i$. Then, E(i), the encoded representation of the integer i, may have the form: $\langle P_i, I_i \rangle$. In other words, the encoded representation of the integer i may include a FLH representation of the position of the LO in $\beta_i$, followed by a variable length code representation of the frustum or the digits of $\beta_i$ that reside to the right of the LO of $\beta_i$. It should be understood, that the LO is truncated from the E(i) representation as the LO's value is always one. However, in other examples, the LO may be appended to the FLH representing $P_i$ prior to appending $I_i$.

For instance, in one example, a system may be implemented using a thirty-two-bit scheme. In a system implementing a thirty-two-bit scheme, an encoding component may receive integers, such as "1", "2", "3", etc. and convert the thirty-two-bit representation of these numbers into an encoded representation, E(i), as discussed above. For example, the fixed length binary code of the value "1" is thirty-one zeros followed by a one or "00000000000000000000000000000001". In an example notation, the left most bit of "00000000000000000000000000000001" is considered to be in position thirty-one and the right most bit of "00000000000000000000000000000001" is in position zero. The encoding component may determine the position of the LO, for instance, by walking through the binary representation starting on the left until reaching the leading-1. Alternatively, a priority encoder may be used to determine the position of the LO.

In some implementations, the encoding system may represent the position of the LO as a five-bit binary fixed length representation or header, $P_1$, or "00000" for the integer "1". The encoding component may then prepend the frustum or the bits remaining to the right of the LO to $P_1$. However, in this example, there are no bits to the right of the LO so E(1) may be the fixed length header "00000".

In another example, if the encoding component receive the value of "9" having a fixed length code binary representation in thirty-two bits of "00000000000000000000000000001001", the encoding component may generate the encoded representation, E(9), as "00011001". This is explained as follows. In the thirty-two-bit representation of "9" the LO is in position three. Three converted to a five-bit fixed length binary header, $P_9$, is "00011". Additionally, to the right of the LO are the remaining bits "001" which may be appended onto the $P_9$ to provide the encoded representation, E(9), of "00011001". Similarly, E(31) in a thirty-two-bit scheme may be written as follows: 31 represented in thirty-two bits is "00000000000000000000000000011111" with the LO at position four. Four converted to a five-bit fixed length binary header is "00100". Additionally, to the right of the LO is the frustums "1111" which is appended onto the $P_{31}$ to provide the encoded representation, E(31), of "001001111".

In some cases, additional data encoding may be achieved by using a fixed length code (FLC) representing the scheme being used to encode i. For example, if the system is implementing a sixty-four-bit encoding scheme then $P_i$ may be six bits in length. However, values of i that are less than "256" may be represented using an eight-bit representation as opposed to a sixty-four-bit representation. Likewise, values less than "65,536" may be represented using a sixteen-bit code and values less than "4294967296" may be represented using a thirty-two-bit code. In these systems, the encoding component may utilize a two-bit FLC, $Z_i$, as a prefix to the FLH representing the length of the $P_i$ to follow.

For example, "00" may indicate a three-bit $P_i$, "01" a four-bit $P_i$, "10" a five-bit $P_i$, and "11" a six-bit $P_i$. In this example, E(i), the encoded representation of the integer i, may have the form: $\langle Z_i, P_i, I_i \rangle$. Thus, when i is less than "256", $Z_i+P_i$ is five-bits in length as opposed to using a fixed length $P_i$ of six bits in length. Additionally, when the value of i is greater than 255 and less than "65,536" $Z_i+P_i$ is six-bits in length or equal to a fixed length $P_i$ of six bits in length. Thus, when a majority of the values of i are smaller than 256, additional compression may be achieved within systems using larger bit schemes. Additionally, in some encoding implementations, the value zero may be included by representing every integer in the range [0, 1, 2, . . . , n] by its successor ([1, 2, 3, . . . , n+1]). Furthermore, in some implementations an additional flag bit may be used to represent positive, and negative numbers. Hence, in this case an alternative way to represent zero is by representing every value in the range [0, −1, −2, . . . , −n] by the value of its predecessor. Hence, in one particular example, the value zero is represented by shifting the binary representation of each value down by 1. that is, 0 is represented by −1, −1 is represented by −2 etc. In other particular examples, positive integers may be represented by positive odd integers; while, zero and negative integers may be represented by positive even integer. Alternatively, this scheme may be altered by using odd positive integers to represent zero and negative integers, while using even positive integer to represent the positive integers. Additionally, methods such as variants of 1's complement. 2's complement and biased (excess) representation of positive and negative numbers can be used in tandem with SIGBITS.

In a system configured to encode data according to the encoded representation E(i), the decoding may be achieved by having a known length of $P_i$, such as P (e.g., P may be equal to the number of bits used to represent $P_i$). For example, the decoding may prepend the appropriate number of bits with having a value of "0" based on the value indicated by $P_i$, followed by a bit with having a value of "1" to the remaining bits $I_i$. In some cases, the system may represent the number of bits with having a value of "0" based on the bit-wise inverse of $P_i$ (e.g., one's complement).

In another example, a SIGBYTES compression technique may be used to compress and decompress integers. For example, a SIGBYTE encoding component may be configured to receive non-negative integer values (i.e., integers that are greater than or equal to zero) represented in thirty-two-bit fixed length code scheme. For example, non-negative integers (i.e., integers that are greater than or equal to zero) constrained to 32 bits (i.e., values of less than 4,294, 967,296) may be encoded as discussed below. A thirty-two-bit integer k may have a binary representation of $\beta_k$ with zero or more bits of '0' prepended to the left of $\beta_k$. Let $J_k$ be the minimal representation of $\beta_k$ using bytes and let $Q_k+1$ be the minimum number of bytes required to represent $\beta_k$ (i.e., $Q_k$ 1 is the number of bytes in $J_k$). The component $J_k$ is referred to as the byte-frustum of k. For thirty-two-bit fixed length integers the range of possible values for $Q_k+1$ are 1, 2, 3, and 4. Hence, the range of values for $Q_k$ is 0, 1, 2, and 3; and $Q_k$ can be represented with a 2-bit fixed length header. Below, the notation $E(k)=\langle Q_k J_k \rangle$ is used as the SIGBYTES representation of the value k.

For instance, in one specific embodiment of SIGBYTES, if k is set to equal 9, then the thirty-two-bit representation of k is '00000000000000000000000000001001'. In this instance, $\beta_9$ is equal to '1001'. Thus, $J_9$ is equal to '00001001'. Furthermore, in this case, $Q_k$ 1=1 and $Q_k$ can be represented as '00'. Thus, E(9), the encoded representation of the integer under SIGBYTES, may have the form: E(9)= $\langle Q_9, j_9 \rangle = \langle 00,00001001 \rangle$ ='0000001001'. In the implementations below, the SIGBYTES encoded integers may be combined by merging the headers of four integers into one byte and the byte-frustums of these integers in consecutive bytes.

In other examples, compression using a dictionary referred to as a symbol-table may be used. For example, each symbol might be a member of the ASCII set of characters or a member of the Unicode set of characters. In the illustrated example, logic associated with a compression system and a decompression system using a dynamic dictionary compression method, referred to as LFLR is discussed. In some cases, LFLR is a method of coding used for lossless data compression. Unlike other variable-length codes, LFLR coding may map a variable set of source symbols to data elements with fixed number of bits. Thus, LFLR may represent variable-length input symbols using fixed-length code-units. Due to the regularity, the LFLR encoding may be advantageous for hardware implementation. Variants of the LFLR approach might assume that the probability of occurrence of symbols is known to the encoder and the decoder and it does not change with time. These variants lend themselves to an implementation that use static dictionary. However, the system discussed herein does not make these limiting assumptions. Instead, the system discussed herein utilizes a dynamic approach wherein the encoder and the decoder are configured to construct and manage the dictionary as symbols arrive.

Under LFLR, a symbol-table might contain parts that are virtual i.e., entries that are implied by the method and do not require material implementation. Other parts of the dictionary are "real" and require physical implementation. The data stored in the symbol-table may consist of symbols, symbol pairs, triples, and in general, topples of n-symbols (1≥n) where a topple of n-symbols is referred to as a string. In some cases, LFLR distinguishes between the two types of elements in the symbol-table. The first set of elements contain prime strings. These strings, are generally, the most commonly occurring strings and serve as headers of other strings and can be appended by prime and by non-prime strings. The second type of elements is referred to as non-prime strings. Non-prime strings cannot be appended by any other string. The distinction between prime and non-prime strings as well as the determination of which strings should be evicted from the table, and under what circumstances symbol-table entries should be evicted, are managed via a combination of least recent and least frequent usage (LRU, and LFU). The LRU policy and the LFU policy are enabled by two type of counters: the usage counter, a counter that reflects the number of times that a specific n-symbols topple has been used and the stale counter, a counter that reflects the number of cycles that passed since the last usage of that element. In a specific implementation, the stale counter is incremented periodically until the stale counter reaches the maximal value (Max). At this point the usage counter value might be decreased in several different ways. In this example, when any of the usage counters reaches Max, the system might divide the value of all of the rest of the counters by 2. Eventually low values of usage counter imply low usage frequency and the values of the stale counter denote recency of access. A system might use a combination of frequency and recency. For example, in one embodiment, a table entry stale counter is incremented periodically. When the counter reaches Max, the respective usage counter is decremented by a given constant. Hence, in this embodiment the value of the usage counter embedded the frequency and the recency of access to a table entry.

The symbol-table may include a value (e.g., a string) an increment and/or decrement usage counter used to represent the frequency of usage of each string, a stale counter that holds information about the recency of use of a specific string, a counter that holds the number of empty spaces in the table, and a valid bit. In some cases, each unit within the value may be represented using eight-bits. In some cases, when a usage counter reaches Max, the counter value freezes. In order to avoid a case where many counters are locked at Max, the system periodically decrease the value of all the usage counters (for instance, by dividing the value of each counter by 2). Additionally, each entry in the table includes a stale counter. Initially, all the stale counters are set to 0. The stale counters are incremented periodically by the system. When a stale counter of a specific entry reaches Max the stale counter is locked. Nevertheless, this is a sign that the symbol stored in this entry has not been encountered for a long time and is candidate for removal from the table. Alternatively, when a stale counter reaches the maximal value it is being reset to 0 and at the same time it triggers a decrement operation of the respective usage counter of that entry.

In one example, the operations of the LFLR may be as follows. First, the LFLR system reads a byte from memory, buffer, or other source. The system may check to see if the byte is in the symbol-table. For instance, the system may compare the byte to each entry in the symbol-table. In the examples, below the LFLR system may maintain a symbol-table with singleton and pairs. However, it should be understood that longer n-symbol strings may be used.

In a first case, the byte may not be in the symbol-table. In this case the system may output an exception code along with the byte. The LFLR system may then determine if there is available space in the symbol-table. If there is space in the symbol-table the system may insert the byte as an entry in the table, set its usage counter to one, and its stall counter to zero. In some specific examples, the usage counter may be implemented as a buffer or register that is initiated to a single "1" bit wherein the location of the most significant bit of "1" within the buffer indicates the value of the usage counter. In this example, when we update the symbol-table, the usage counter may be incremented by 1 through left shifting the value and inserting bits with a value of 1 to the right of the register for each left shift. It may be decremented by right shifting the buffer by "1" with an insertion of bits of "0" at the left. The value of the counter may then be determined using a priority encoder.

If, however, there is no available space in the symbol-table, the system may double the size of the symbol-table provided that the doubled size does not exceed a predetermined value. If doubling is not an option, the system may evict the least recently used and/or the least frequently used (e.g., the entry with the lowest value in the usage counter). The system may then store the byte in the entry previously storing the evicted value. A flag bit may then be used to denote if the entry contains a valid value.

In a second case, the byte may be in the symbol-table (e.g., there was a match between an entry in the table and the byte). When the byte is in the symbol-table, the system may next check to see if the byte is a prime value; that is, it is a prefix in a topple or a topple head. If the byte is a prime-value and a prefix in the topple, the system may read the next input byte. The next input byte may then be checked to see if the second byte has already been paired to the first byte (e.g., the originally received byte). This may be done by checking the pair-table.

In some embodiments, the pair table is a "virtual" table. That is the table entries are implied by some method and do not occupy physical space. In the context of this patent application, the symbol table is composed of two portion: a "real" singleton portion a virtual pair portion. If the second byte is not paired to the first byte, the system outputs the index of first byte and updates the table entry (e.g., counters and valid bit) of the first byte. The LFLR system may then treat the second byte as a new input byte and update the symbol-table as discussed above. For example, if the second byte is a non-prime single byte that resides in the symbol-table, the system also outputs the second byte and updates the table-entry for the second byte. If the second byte is not in the symbol table, the system may send exception code, followed by the byte, and then update the table.

In some cases, the string entries or non-singleton entries may include more than two symbols. In these cases, the process discussed above may repeat for each consecutive symbol in the string. In the case of LFLR the output units are fixed but are not necessarily an integral part of 8 (i.e., they are not necessarily bytes) in this cases, packing the output following encoding and unpacking it before decoding may be beneficial for hardware efficiency. Further, in some other cases, and other encoding schemes, since the encoding process produces variable length encoded representations, to enable efficient storage and transmission and better data throughput, the encoded representations may be packed. For instance, one example of such a way might be packing four encoded integers together, as will be described in more detail below. Such implementation enables efficient use of byte addressable memory and higher throughput as the system is able to encode and decode four integers in parallel. Additionally, a general mechanism for packing and un-packing of encoded and decoded data is described in this application. This mechanism well suits the LFLR and can be used for many other encoding and decoding methods.

LFLR is a dynamic process. In some examples, as the encoder state (e.g., setting of counters) changes, the decoder should be in full synch with the new state. In LFLR, the encoder and the decoder work dynamically in tandem; in the following way. As described above, the encoder uses the current symbol-table to make a decision about the next code to be transmitted. Next, the encoder sends the code to the decoder and updates the table. On the other hand, the decoder receives the code and uses the current table to encode this code. Next the decoder updates its own table and state in a way that ensures synchronization. Hence, the decoder is synchronized with the encoder. Note that the operations performed by the decoder for each step are almost identical to the steps performed by the encoder at that step. For example, the insertion into the table and the table update operations performed by the decoder are identical to the insertion into the table and table update operations performed by the encoder.

FIG. 1 illustrates a block diagram showing select components of an example encoding and decoding system 100 according to some implementations. For instance, the system 100 may include an encoding component 102, a pack component 104, an unpack component 106, and a decoding component 108. In general, the encoding component 102, the pack component 104, the unpack component 106, and the decoding component 108 may be part of an arithmetic logic unit, operating between the arithmetic logic unit and registers or other temporary memory, between different cache levels of a memory, between cache and other memory devices, or between a compute-unit and other system components such as data transmitters.

In the illustrated example, the encoding component 102, the pack component 104, the unpack component 106, and the decoding component 108 are shown between a main memory 110 or permeant storage device that is configured to store data in packed and encoded representation and a temporary memory 112. For example, the packed and encoded representation of a data-token, generally indicated by 114, may be provided to the unpack component 106 in response to the main memory 110 receiving a memory read command. The unpack component 106 may unpack the packed and encoded representation of integer data into encoded representation of individual data-tokens 116. The encoded representation of individual data-token 116 are then decoded by the decoding component 108 into a fixed length code (for example, 32-bit as used in the SIGBITS example above) binary representation of $\beta_i$ 118 of individual integers (in this case the data-token is an integer). In the current example, the fixed length code binary representation of $\beta_i$ 118 of the integers may have the correct number of bits for the system 100 prior to storing the fixed length code binary representation of $\beta_i$ 118 in temporary memory 112 (e.g., a cache memory).

For instance, in a SIGBITS example, the unpack and decoding component 104 may prepend the appropriate number of bits with having a value of "0" based on the value indicated by $P_i$, followed by a bit with having a value of "1" (e.g., the LO) to the remaining bits $I_i$. However, in other examples, it should be understood that the data may be stored in an unpacked and encoded representation or that similar packing and unpacking operations are applied to other types of data-tokens such as 8-bit symbols.

In the SIGBITS example, once the fixed length code binary representation of $\beta_i$ 118 is stored in temporary memory 112. A processor 120 or other processing component may then access the temporary bits and process the fixed length code binary representation of $\beta_i$ 118. Following one or more operations, the processor 120 may write data having a fixed length code binary representation of $\beta_j$, generally indicated by 122, into the temporary memory 112. The fixed length code binary representation of $\beta_j$ 122 of the data may be received by the encoding component 102. The encoding component 102 may determine a position of the LO and encode the position as $P_j$. The encoding component 102 may then truncate the LO from $\beta_j$ 122 and prepend $P_j$ to the remaining bits or $I_j$ to generate the encoded representation, E(j), 124. The pack component 104 may receive the encoded representation 124 of one or more individual integers and merge the encoded representation into sets of encoded integers 126 for more efficient storage and access. The packed and encoded data 126 may then be stored in the main memory 110.

In some cases, the data may be stored in variable length units (e.g., segments) in the main memory 110 and in fixed length units (e.g., blocks) in the temporary memory 112. A memory mapping unit 128 may be configured to interface with the main memory 110 and the temporary memory 112 to build and maintain a memory mapping scheme between the encoded data stored in the main memory 110 and the decoded data stored in the temporary memory 112. Furthermore, the memory management unit might enable random access to compressed/uncompressed data. Additionally, it should be understood that depending on the configuration, the main memory 110 and the temporary memory 112 may be an example of tangible non-transitory computer storage media and may include volatile and nonvolatile memory and/or removable and non-removable media implemented in any type of technology for storage of information such as computer-readable instructions or modules, data structures, program modules or other data. Such computer-readable media may include, but is not limited to, RAM, ROM, EEPROM, flash memory or other computer-readable media technology, hard drives, CD-ROM, digital versatile disks (DVD) or other optical storage, magnetic cassettes, magnetic tape, solid state storage, magnetic disk storage, RAID storage systems, storage arrays, network attached storage, storage area networks, cloud storage, or any other medium that may be used to store information and which can be accessed by the processor 120. Further, in the current example, the encoding component 102 and the pack component 104 are shown as separate components. However, it should be understood that in some implementations, the encoding component 102 and the pack component 104 may be integrated into a single component. Likewise, the unpack component 106 and the decoding component 108 may be integrated into a single component.

In the above description of FIG. 1, the implementation is explained using a SIGBIT example, however it should be understood that the system 100 may be used to encode and decode using SIGBYTE, LFLR or other encoding and decoding methods, in other examples, as discussed in more detail below. For instance, in the case of the LFLR, the fixed length code binary representation of $\beta_i$ 118 may be replaced by symbol 118.

Figure 2:
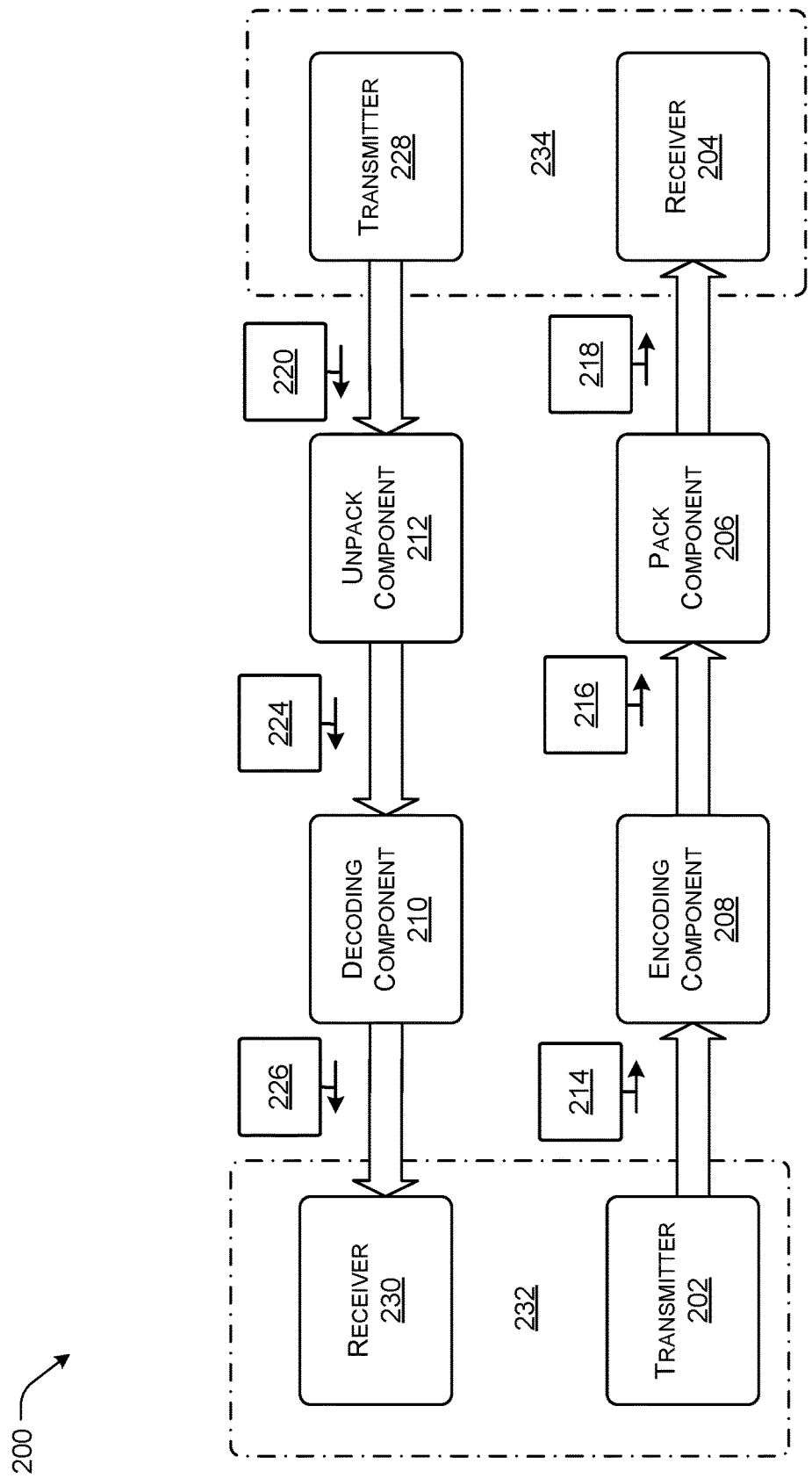
FIG. 2 illustrates a block diagram showing select components of an example encoding, decoding, packing, and unpacking components according to some implementations.

FIG. 2 illustrates a block diagram showing select components of an example encoding and decoding system 200 according to some implementations. In the current example, the system 200 may be placed between first device (such as a processor, memory, controller, wireless transmitter, system bus, etc.) and a second device (such as a processor, memory, controller, wireless transmitter, system bus, etc.). Further, the unit labeled 232 as well as the component labeled 234 may contain any number of receivers and transmitters. These receivers and transmitters may work in tandem or operate independently of other transmitters and receivers. For simplicity, in the illustrated example, it is assumed that each of the units 232 and 234 contain one receiver and one transmitter. In the current example, data to be transmitted by unit 232 is available to transmitter 202. In some cases, the data is to be transmitted in an encoded representation which may or may not be packed for improved access time and throughput. Thus, in the current example, a pack component 206, an encoding component 208, a decoding component 210, and an unpack component 212 may be utilized to convert the encoded and packed data into unpacked and decoded data.

For instance, in a SIGBITs example, the transmitter 202 may transmit integers 214 in a decoded format to be accepted by a receiver 204 before being available to devices connected to unit 234. The encoding component 208 may receive the integers 214 and generate encoded integers 216. In other examples, such as LFLR the transmitter may transmit symbols 214 and the encoding component 208 may receive the symbols 214 and generate encoded symbols 216. Thus, in some cases, data passed from the source to the encoding component 208 may be data-token 214 as explained above.

With regard to the SIGBITs example, the encoding component 208 may determine a position of a LO within each positive integer of the integers 214 and encode the position of the LO as $P_i$ for each integer i within the integers 214. The encoding component 214 may then prepend $P_i$ to the bits to the right of the LO in the thirty-two-bits or any other length binary representation of $\beta_i$ of the integers 214 to generate an encoded representation of the integers E(i), 216.

The encoded integers 214 may then be packed by the pack component 206. For example, the encoding component 208 may generate variable length code-words. Thus, to enable efficient transmission or storage and to enable better data throughput the encoded representations of the integers 216 may be packed. For instance, the pack component 206 may pack integers into fixed size blocks prior to the receiver 204 receiving the packed and encoded integers 218.

In some cases, unit 234 of system 200 may also transmit compressed data. In these cases, a transmitter 228 may provide an encoded and packed representation of an integer 220 to the unpack component 212 to separate the sets of encoded integers, generally indicated by 224.

The decoding component 210 may receive the unpacked integers 224 and decode the integers 224 into a fixed length code binary representation of $\beta_i$ 226 having the correct number of bits for the data source 202. For example, the decoding component 210 may prepend the appropriate number of bits having a value of "0" based on the value indicated by $P_i$, followed by a bit having a value of "1" (e.g., the LO) to the remaining bits of $I_i$ (e.g., the bits not used to represent $P_i$). Thus, the decoding component 210 is able to determine the value of $P_i$ and decode the integers 224. Finally, the decoded data (e.g., the binary representation of $\beta_i$ in the SIGBITS example above) may be received at a receiver 230 for use by various other systems or devices.

In the illustrated example, the receiver 230 and transmitter 202 as well as transmitter 228 and the receiver 204 are shown as separate components of the system 200. However, in other examples, the receiver 230 and transmitter 202 may be combined into a single component, such as component 232. Likewise, the transmitter 228 and the receiver 204 may be combined into the component 234.

In the above description of FIGS. 1 and 2, the implementation is explained using a SIGBIT example, however it should be understood that the system 100 and 200 may be used to encode and decode using SIGBYTE or LFLR in other examples, as discussed in more detail below.

Figure 3:
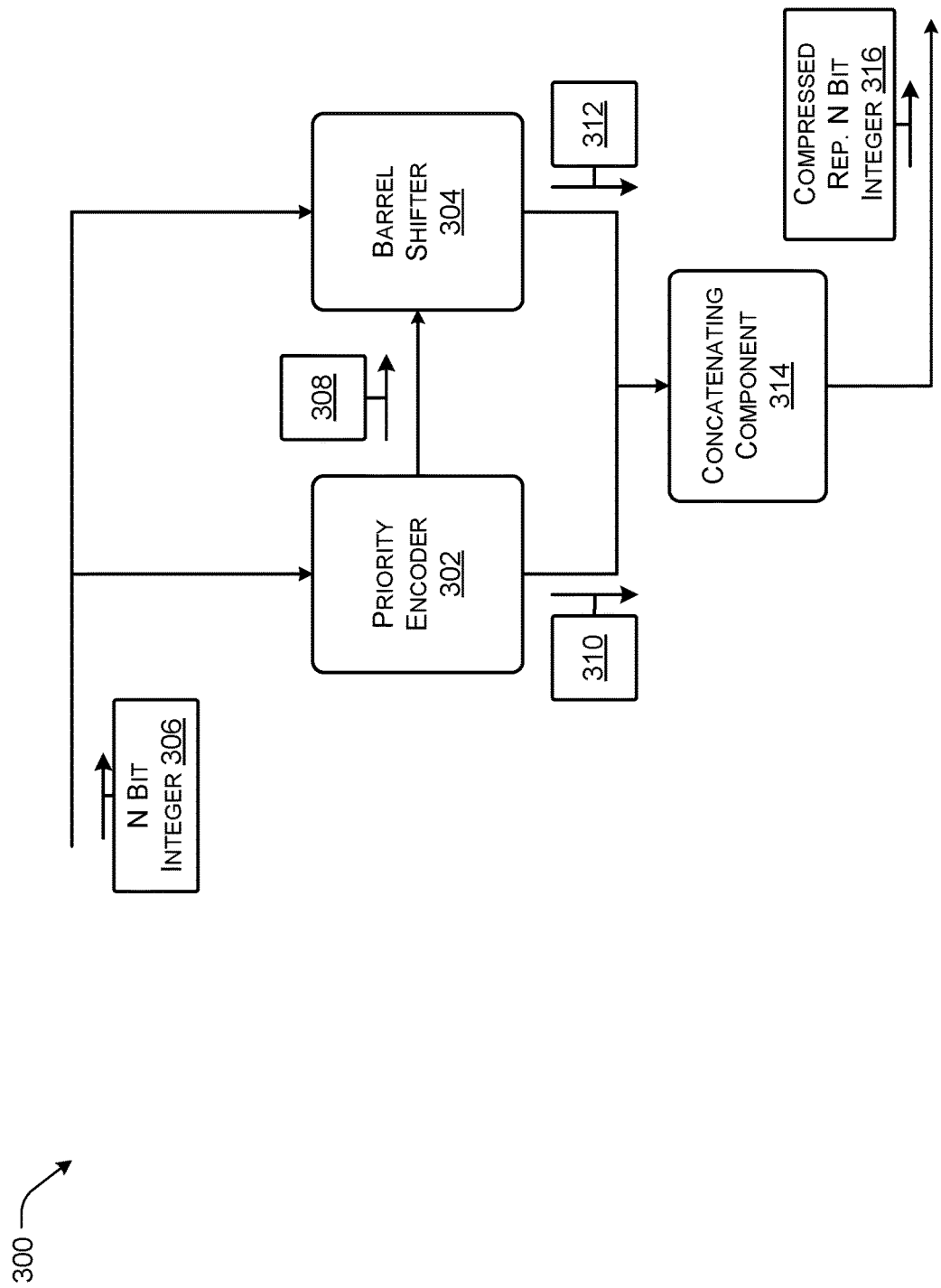
FIG. 3 illustrates a block diagram showing an example encoding component according to some implementations.

FIG. 3 illustrates a block diagram showing an example encoding component 300 using SIGBITS according to some implementations. In the illustrated example, the encoding component 300 is configured to process single n-bit integers. In the current example, the encoding component 300 includes a priority encoder 302 and a barrel shifter 304. The priority encoder 302 may receive a fixed length code binary representation of the n-bit fix length code binary representation of i, 306. The priority encoder 302 may determine the position of the LO of $\beta_i$ generally indicated by $P_i$ 310 and determine a number of shifts generally indicated by P 308 to remove the LO and the leading zeros from the n-bit fix length code binary representation of i. Thus, the priority encoder 302 may output $P_i$ 310 and a value P 308.

The value 308 may be provided to the barrel shifter 304 as shown. In this example, the barrel shifter 304 may be a left n−1 bit shifter configured to receive n−1 least significant bits of n-bit integer 306 and to perform a number of left shifts based on the value P 308. Since the barrel shifter 304 is a n−1 bit shifter, the leading zeros and the LO are truncated from the fixed length code binary representation of the n-bit integer 306 by the barrel shifter leaving the frustum (e.g., the $I_i$ bits), generally indicated by 312.

A concatenating component 314 may receive $P_i$ 310 from the priority encoder 302 and the frustum $I_i$ 312 from the barrel shifter 304. The concatenating component 314 may concatenate the frustum $I_i$ 312 to the right of the $P_i$ 310 to generate the encoded representation E(i) of the n bit integer 316.

In the current example, the fixed length header $P_i$ represent the position of the LO within the binary representation of the integer. However, in other implementations, $P_i$ may be utilized to represent the number of zeros to the left of the LO.

Figure 4:
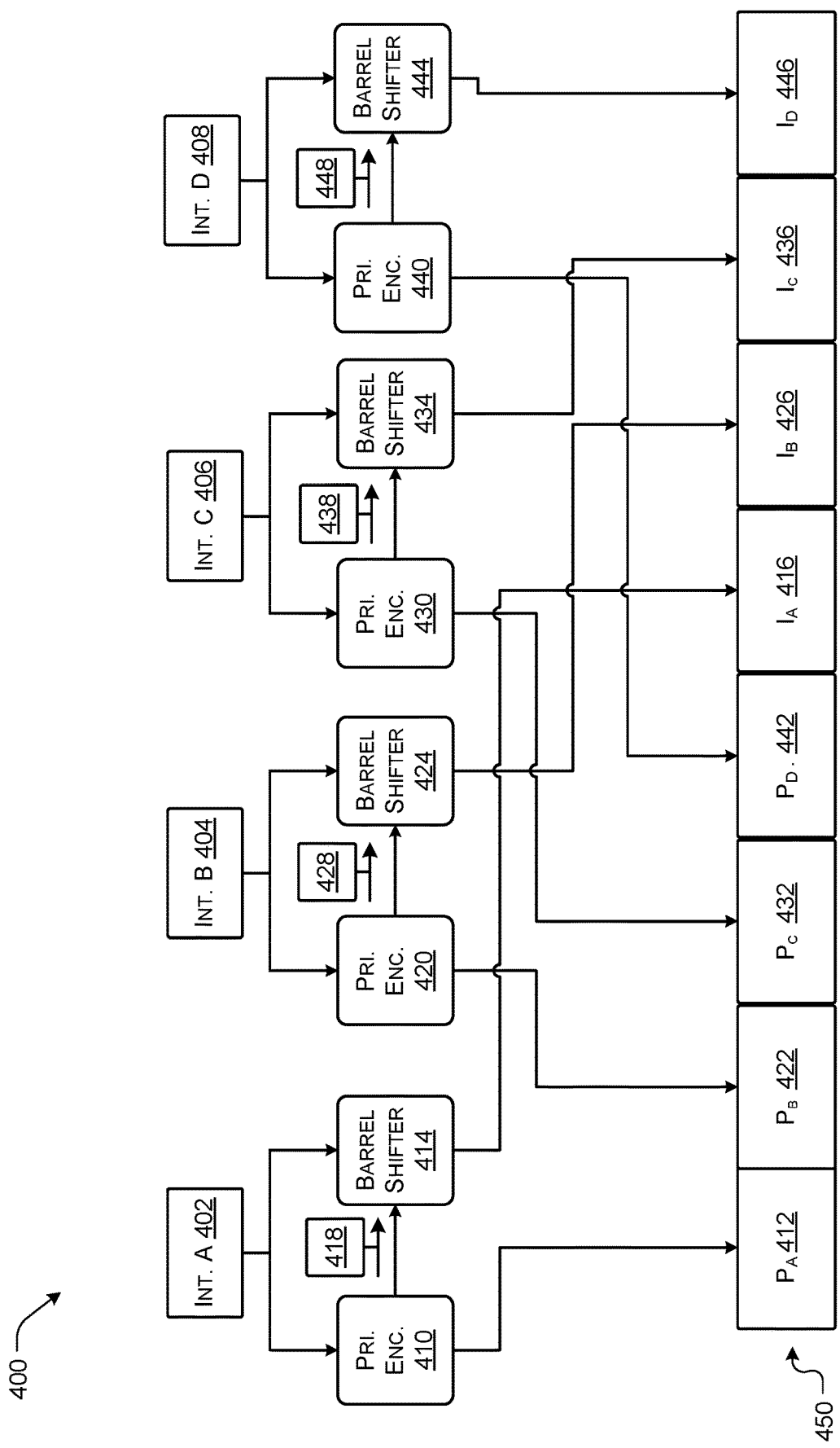
FIG. 4 illustrates a block diagram showing an example encoding and packing component according to some implementations.

FIG. 4 illustrates a block diagram showing an example encode and pack component 400 using SIGBITS according to some implementations. In the current example, the encode and pack component 400 is encoding and packing four n-bits integers, A, B, C, and D, generally indicated by 402, 404, 406, and 408 respectively. Each integer A, B, C, and D 402-408 is encoded according to the mechanism of the single integer encoding as described above with respect to FIG. 3. For example, a priority encoder 410 may determine $P_A$ 412 and barrel shifter 414 may determine frustum $I_A$ 416 based on the value P 418 received from the priority encoder 410. Likewise, a priority encoder 420 may determine $P_B$ 422 and barrel shifter 424 may determine frustum $I_B$ 426 based on the value P 428 received from the priority encoder 420, a priority encoder 430 may determine $P_C$ 432 and barrel shifter 434 may determine frustum $I_C$ 436 based on the value P 438 received from the priority encoder 430, and a priority encoder 440 may determine $P_D$ 442 and barrel shifter 444 may determine frustum $I_D$ 446 based on the value P 448 received from the priority encoder 440. In the current example, the encoded representation of the integers A, B, C, and D, generally indicated by 450, may be stored or encoded as $\{P_A\|P_B\|P_C\|P_D\|I_A\|I_B\|I_C\|I_D\}$ where the symbol '$\|$' denotes concatenation.

In some cases, it should be understood that the implementation of the system 400 may include additional levels or number of barrel shifters to concatenate the 'I' results of the barrel shifters 414, 424, 434, and 444. Additionally, while the current example shows four integers encoded together, any number of integers with any type of fixed length coding representation (e.g., 8-bits, 16-bits, etc.) may be encoded together to allow flexibility in the system 400. For example, the system 400 may be configured for four thirty-two-bit integers but also allow for encoding of a single one hundred and twenty-eight-bit integer. However, it should be understood, that in other instances the system 400 may process other fixed length code binary representations.

Figure 5:
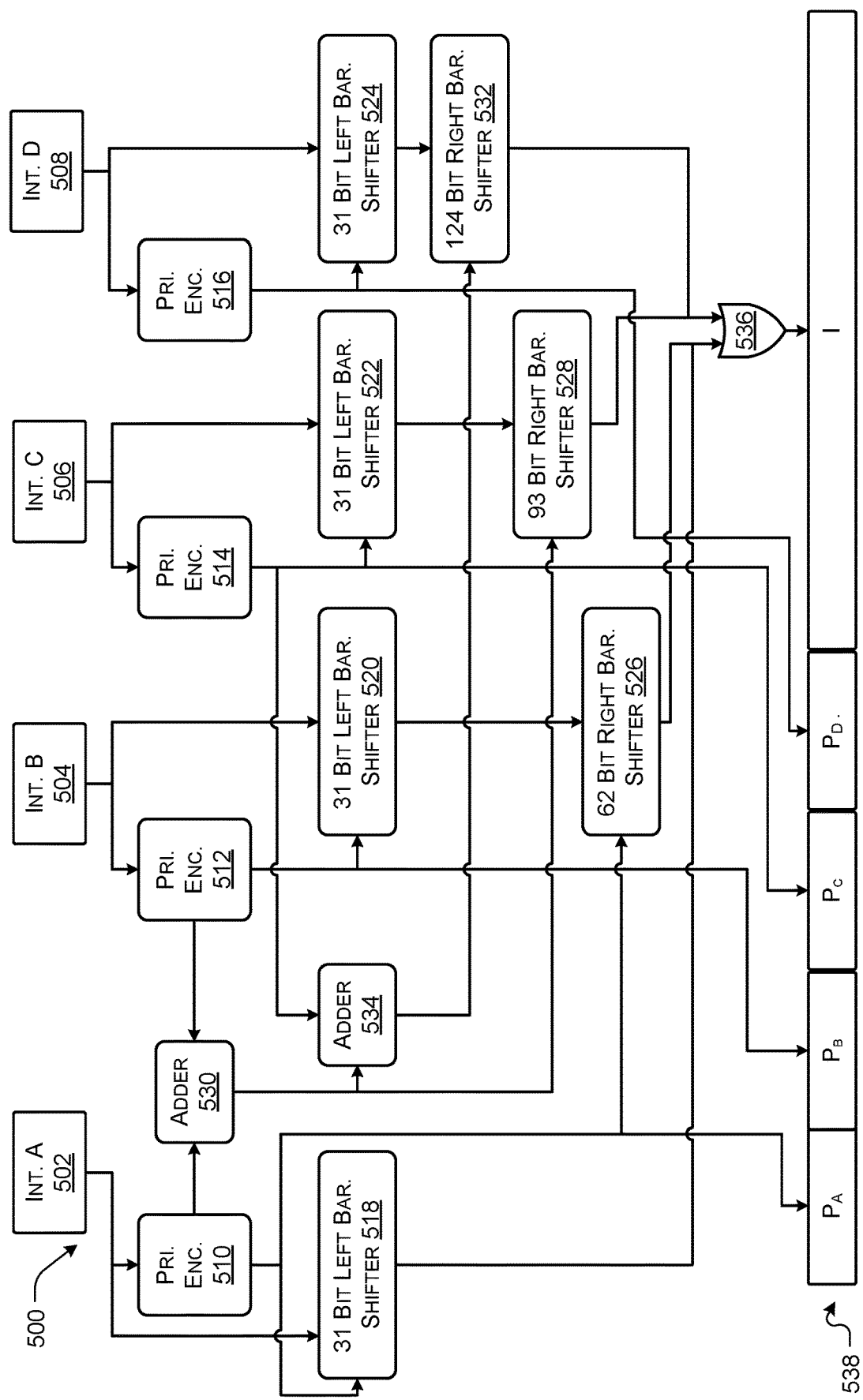
FIG. 5 illustrates a block diagram showing an example combined encoding and packing component configured to receive integers represented in thirty-two-bit scheme according to some implementations.

FIG. 5 illustrates a block diagram showing an example combined encode and pack component 500 using SIGBITS and configured to receive integers represented in thirty-two-bit scheme according to some implementations. For example, the system 500 may be a specific example of an embodiment associated with the system 400 of FIG. 4 for the processing of thirty-two-bit integers.

In the current example, four integers A, B, C, and D 502-508 may be encoded and packed together. Initially, a priority encoder 510 may determine $P_A$, a priority encoder 512 may determine $P_B$, a priority encoder 514 may determine $P_C$, and a priority encoder 516 may determine $P_D$. With respect to FIG. 5, each of the $P_A$, $P_B$, $P_C$, and $P_D$ may be passed as a control input to a corresponding left barrel shifter. In the thirty-two-bit implementation, shown in FIG. 5, each of the $P_A$, $P_B$, $P_C$, and $P_D$ is passed to the corresponding thirty-one-bit left barrel shifter 518-524. Additionally, it should be understood that the corresponding thirty-one-bit left barrel shifters 518-524 also receive the thirty-one least significant bits of each of the corresponding integers A, B, C, or D as data inputs. In some cases, the control input (e.g., $P_A$, $P_B$, $P_C$, and $P_D$) may cause each of the thirty-one-bit left barrel shifters 518-524 to shift the corresponding thirty-one least significant bits of each of the data inputs.

In some cases, to ensure alignment additional barrel shifters may process the output of barrel shifters 520, 522 and 524. For example, with respect to integer B, the thirty-one-bit left barrel shifter 520 may output left aligned $I_B$ that is received as an input for a sixty-two-bit right barrel shifter 526. The sixty-two-bit right barrel shifter 526 may also receive a control input $P_A$. With respect to integer C, the thirty-one-bit left barrel shifter 522 may output a left aligned $I_C$ that is received as an input for a ninety-three-bit right barrel shifter 528. The ninety-three-bit right barrel shifter 528 may also receive a control input that is the value of $P_A+P_B$ following processing by an adder 530. With respect to integer D, the thirty-one-bit left barrel shifter 524 may output left aligned $I_D$ that is received as an input for a one-hundred-and-twenty-four-bit right barrel shifter 532. The one-hundred-and-twenty-four-bit right barrel shifter 532 may also receive a control input that is the value of $P_A+P_B+P_C$ following processing by the adder 530 and an adder 534.

The outputs of the barrel shifters 518, 526, 528, and 532 are provided to a plurality of OR gates, indicated by gate 536, to perform OR operations on, for instance, four busses associated with the output of the barrel shifters 518, 526, 528, and 532 generate the combined frustum I (concatenation of $I_A$, $I_B$, $I_C$, and $I_D$, $I=I_A\|I_B\|I_C\|I_D$), and stored together with the $P_A$, $P_B$, $P_C$, and $P_D$. The length of the packed integers 538 is calculated by the addition of the four P header values, representing the length of the 4 'I' portions. It should be understood that the length of the encoded representation is variable and is based on the position of the LO of each integer A, B, C, and D. For instance, the length of I may vary, or may even be 0 in the case where the four integers are "1". However, in some cases, the encode and pack component 500 may be configured to output a fixed-length packed representation of the four integers. In these cases, the packed integers 538 may include data associated with a proceeding and/or subsequent sets of integers.

In the current example, $P_A$, $P_B$, $P_C$, and $P_D$ are concatenated to the frustum I within the encoded representation 538. However, it should be understood that in other examples, $P_A$, $P_B$, $P_C$, and $P_D$ may be concatenated to the right of the frustum I within the encoded representation 538.

Figure 6:
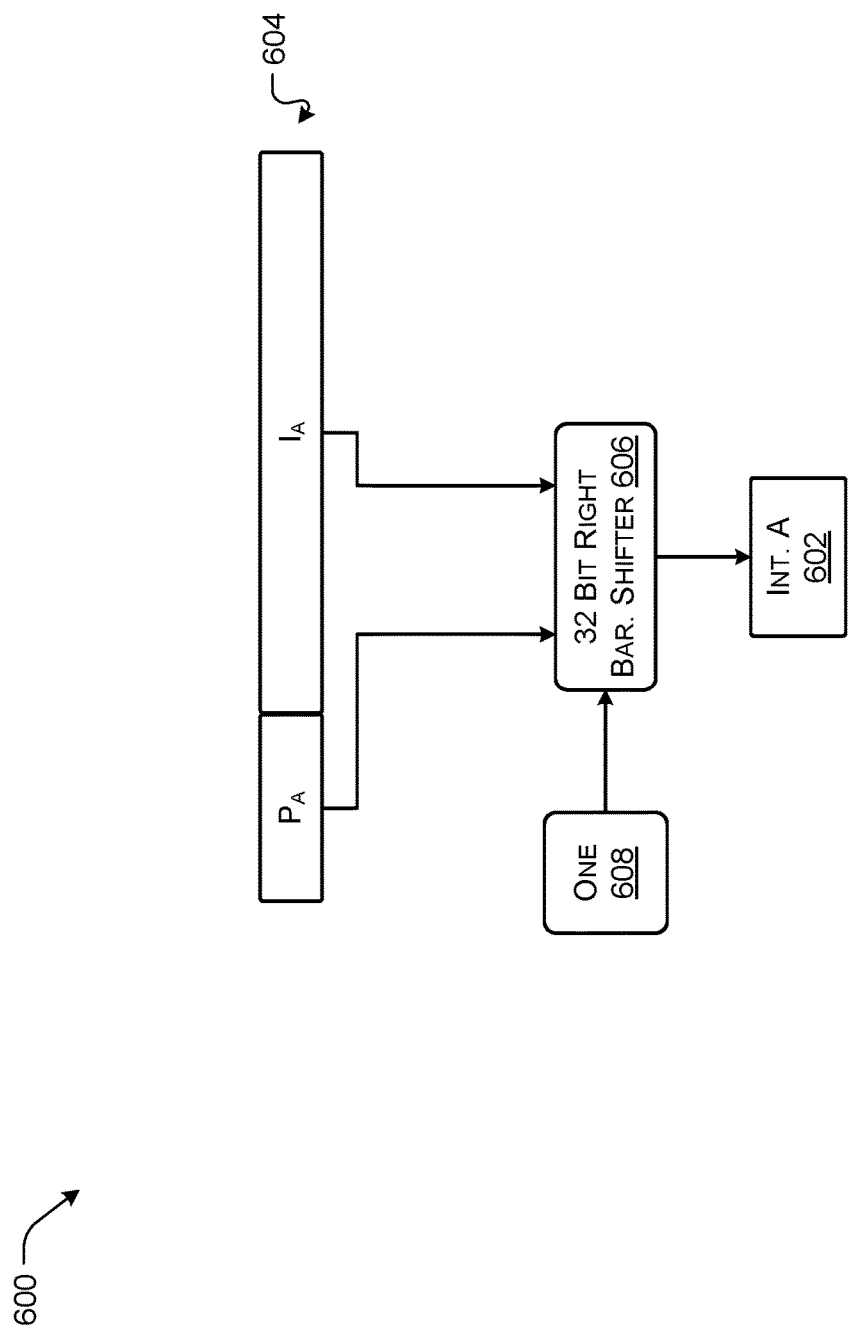
FIG. 6 illustrates a block diagram showing an example decoding component configured to receive an encoded integer according to some implementations.

FIG. 6 illustrates a block diagram showing an example decode component 600 configured to receive an encoded integer using SIGBITs according to some implementations. For example, an integer A 602 may be stored in an encoded format, such as stored as ⟨ $P_A$, $I_A$ ⟩, illustrated as 604. In one example, a thirty-two-bit right barrel shifter 606 may receive $P_A$ as a control input and the bits of $I_A$, left aligned, as a data input and prepends the significant thirty-one bits of $I_A$ with a bit 608 having a value of "1". The barrel shifter 606 may shift right with 0 padding by the bit-wise inverse value of $P_A$, and output a decoded or fixed length code binary representation of integer A 602.

Figure 7:
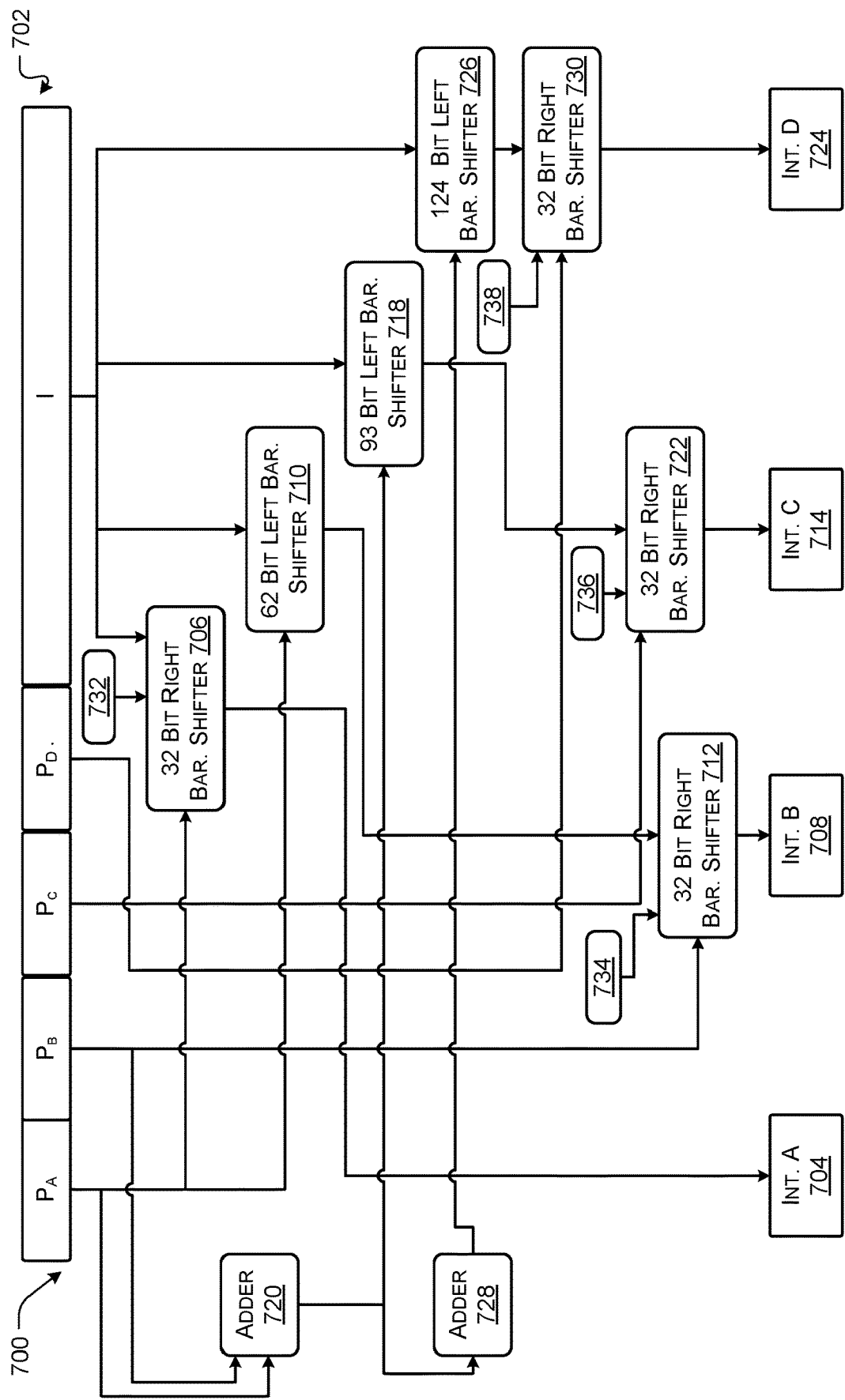
FIG. 7 illustrates a block diagram showing an example unpacking and decoding component configured to receive packed integers according to some implementations.

FIG. 7 illustrates a block diagram showing an example unpack and decode component 700 configured to receive the encoded and packed integers 538 of FIG. 5 according to some implementations. For example, four integers A, B, C, and D 702 stored as $\{P_A\|P_B\|P_C\|P_D\|I_A\|I_B\|I_C\|I_D\}$ may be decoded and unpacked. With respect to integer A 704, a thirty-two-bit right barrel shifter 706 may receive $P_A$ as a control input and the most significant thirty-one bits of I as a data input and prepends the significant thirty-one bits of I with a bit of "1", generally indicated by 732, shift right with 0 padding by the bit-wise inverse value of $P_A$, and output a decoded or fixed length code binary representation of integer A 704. With respect to integer B 708, first a sixty-two-bit left barrel shifter 710 may receive $P_A$ as a control input and the sixty-two most significant bits of I as a data input. The barrel left shifter 710 shifts these sixty-two bits by the value of $P_A$ dropping the bits corresponding to $I_A$. Next, the thirty-one most significant bits of the output of the sixty-two-bit left barrel shifter 710 are selected, they are prepended with a "1", generally indicated by 734, and may be received as an input to a thirty-two-bit right barrel shifter 712, which may also receive $P_B$ as a control input. The barrel shifter 712 shifts these bits right with 0 padding by the bit-wise inverse value of $P_B$ and output a decoded or fixed length code binary representation of integer B 708. With respect to integer C 714, first a ninety-three-bit left barrel shifter 718 may receive an output value of $P_A+P_B$ of an adder 720 as a control input and the ninety-three most significant bits of I as a data input. The Barrel shifter 718 shifts these ninety-three bits by the value of $P_A+P_B$ dropping the bits corresponding to $I_A$ and $I_B$. Next, the thirty-one most significant bits of the output of the ninety-three-bit left barrel shifter 718 are selected, they are prepended with a "1", generally indicated by 736, and may be received as an input to a thirty-two-bit right barrel shifter 722, which may also receive $P_C$ as a control input.

The barrel shifter 722 shifts these bits right with 0 padding by the bit-wise inverse value of $P_C$ and outputs a decoded or fixed length code binary representation of integer C 714. With respect to integer D 724, first a one-hundred-twenty-four-bit left barrel shifter 726 may receive an output value of $P_A+P_B+P_C$ of an adder 728 as a control input and the one-hundred-twenty-four-bit that constitute I as a data input. The left barrel shifter 726 shifts these one-hundred-twenty-four bits by the value of $P_A+P_B+P_C$ dropping the bits corresponding to $I_A$ and $I_B$, and $I_C$. Next, the thirty-one most significant bits of the output of the one-hundred-twenty-four-bit left barrel shifter 726 are selected, the thirty-one most significant bits of the output are prepended with a "1", generally indicated by 738, and may be received as an input to a thirty-two-bit right barrel shifter 730, which may also receive $P_D$ as a control input. The barrel shifter 730 shifts these bits right with 0 padding by the bit-wise inverse value of $P_D$ and outputs a decoded or fixed length code binary representation of integer D 724.

Figure 8:
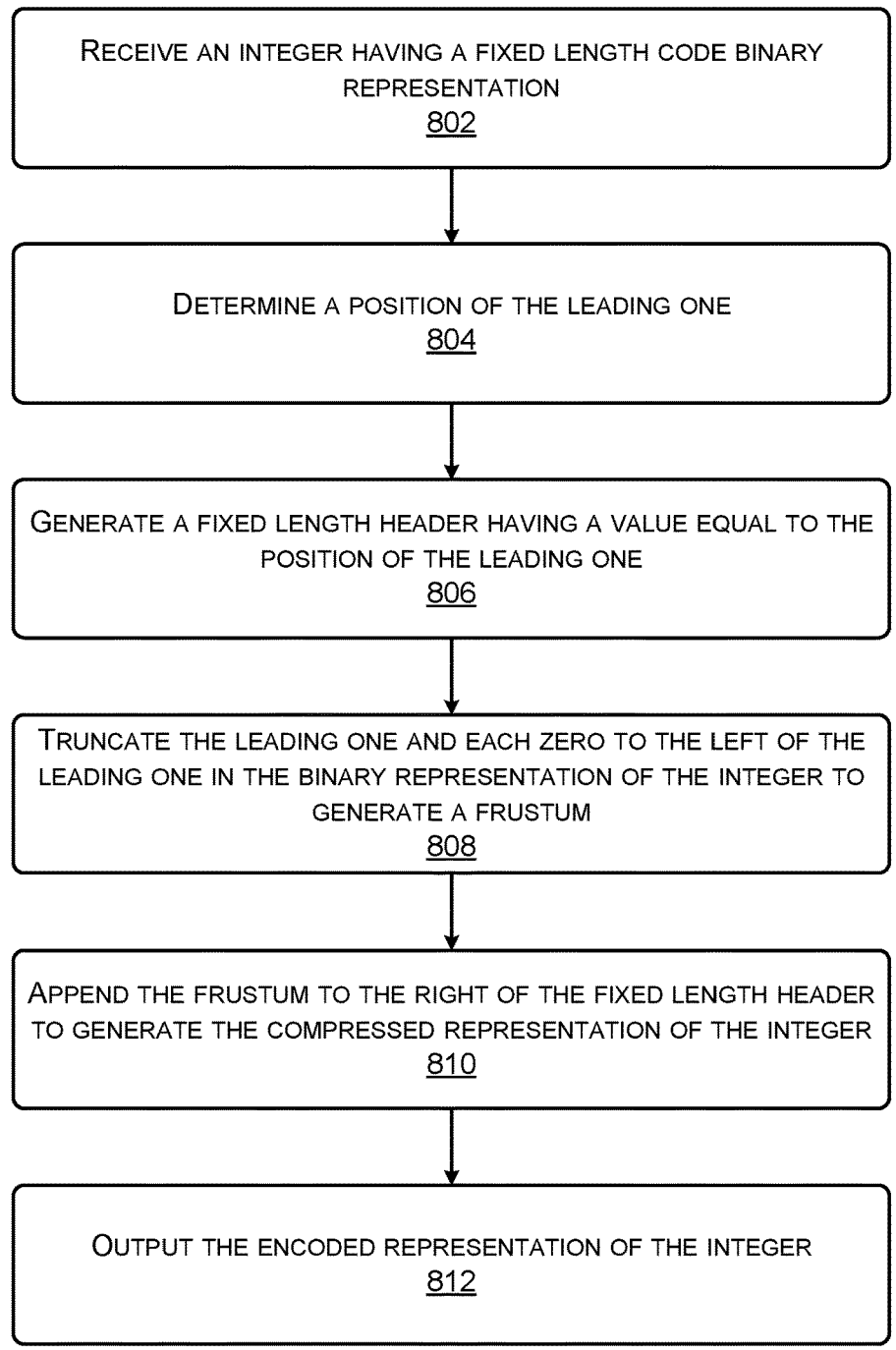
FIG. 8 is example flow diagram showing an illustrative process for encoding integers according to some implementations.
Figure 9:
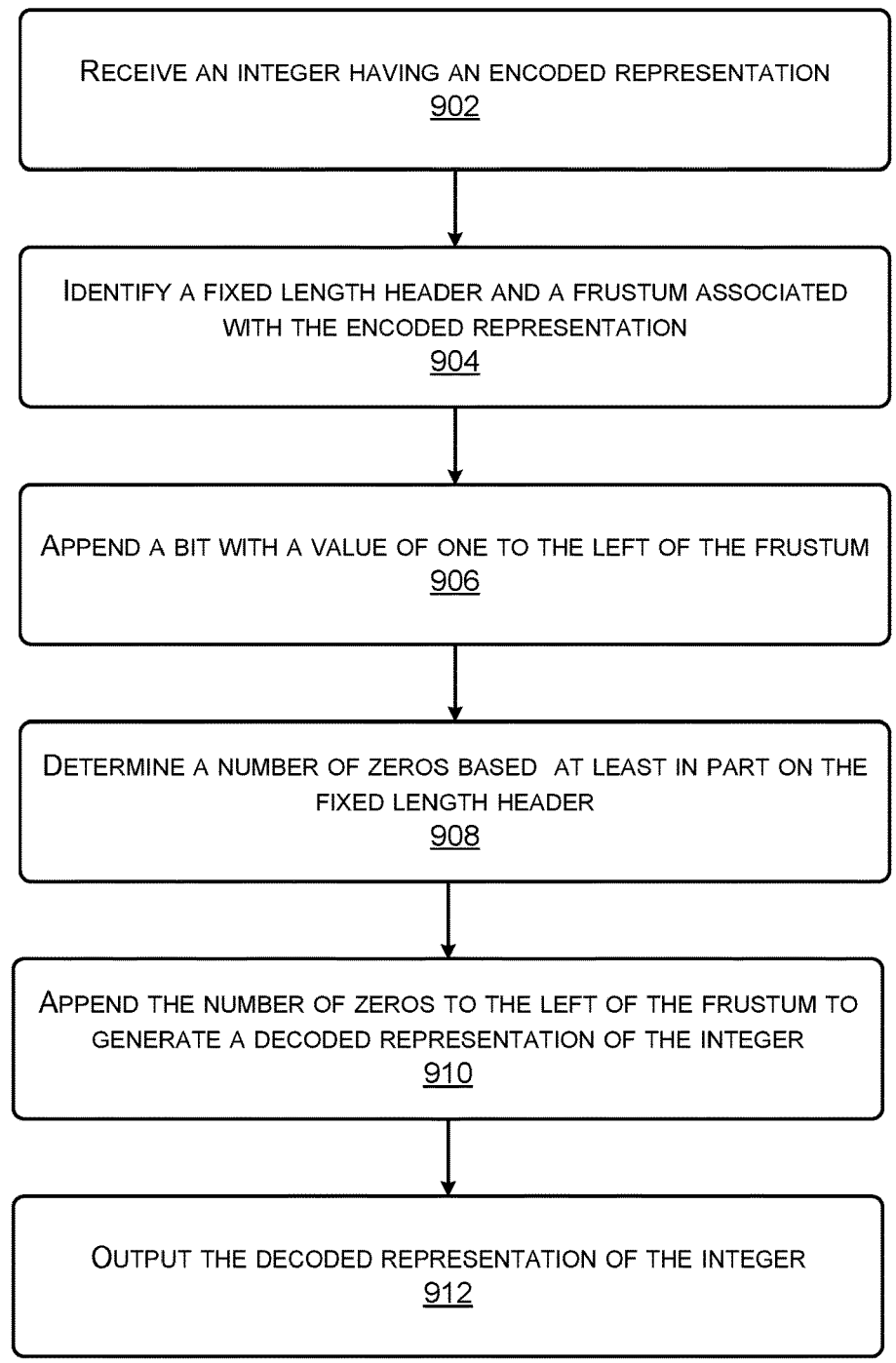
FIG. 9 is example flow diagram showing an illustrative process for decoding integers according to some implementations.

FIGS. 8 and 9 are flow diagrams illustrating example processes associated with encoding integers according to some implementations. The processes are illustrated as a collection of blocks in a logical flow diagram, which represent a sequence of operations, some or all of which can be implemented in hardware, software or a combination thereof. In the context of software, the blocks represent computer-executable instructions stored on one or more computer-readable media which when executed by one or more processors, perform the recited operations. Generally, computer-executable instructions include routines, programs, objects, components, encryption, deciphering, encoding, recording, data structures and the like that perform particular functions or implement particular abstract data types.

The order in which the operations are described should not be construed as a limitation. Any number of the described blocks can be combined in any order and/or in parallel to implement the process, or alternative processes, and not all of the blocks need be executed. For discussion purposes, the processes herein are described with reference to the frameworks, architectures and environments described in the examples herein, although the processes may be implemented in a wide variety of other frameworks, architectures or environments.

FIG. 8 is an example flow diagram showing an illustrative process for encoding integers using SIGBITs according to some implementations. For example, described herein is a system for providing lossless integer encoding at high compression, high throughput, low latency, low energy consumption, and low implementation costs. The system may include an encode and pack component that is configured to convert integers represented in FLC into an encoded representation.

At 802, an encoder may receive an integer i in a fixed length associated with a binary representation $\beta_i$ with one or more leading zeros. For instance, the binary representation of positive integers may include up to thirty-one zeros in a thirty-two-bit scheme. In some implementations, the encoder may be configured to receive integer values represented in eight-bit scheme, sixteen-bit scheme, thirty-two-bit scheme, sixty-four-bit scheme, or other schemes such as one hundred and twenty-eight-bit schemes. In other examples, additional sized schemes may be utilized.

At 804, the encoder may determine a position of the LO. For example, the encoder may include a priority encoder that is able to parse the integer i starting on the left to identify the first non-zero or "1" value (e.g., the LO).

At 806, the encoder may generate a fixed length header $P_i$ having a value equal to the position of the LO in the fixed length code representation of the integer. For example, if the integer i is "1" represented in thirty-two-bit, then this binary representation has the LO in position 0. Thus, the encoder may determine the position of the LO to be 0 and convert the position into a five-bit binary fixed length header, $P_1$, or "00000".

At 808, the encoder may truncate the LO and each zero to the left of the LO in the fix length code binary representation of the integer i to generate the frustum $I_i$. For example, the encoder may include one or more barrel shifter to truncate each of the left zero values and the LO from the remainder of the fixed length code binary representation of i.

At 810, the encoder may append the frustum $I_i$ to the right of the FLH $P_i$ to generate the encoded representation of the integer E(i). Alternatively, the encoder may prepend the fixed length header $P_i$ to the left of the frustum $I_i$ to generate the encoded representation of the integer E(i).

At 812, the encoder may output the encoded representation of the integer E(i). For example, the encoder may output the encoded representation of the integer E(i) to an external source, such as a main memory, cache, or other temporary memory, external component, various cache levels, or to an external component or device, such as a receiver. For example, the encoder may output the encoded representation to a packing unit such that fixed size blocks of packed integers may be stored in the memory device.

FIG. 9 is example flow diagram showing an illustrative process for decoding integers using SIGBITs according to some implementations. For example, one or more integers may have been encoded according the process 300 of FIG. 3. In some cases, the integers may be decoded, for instance, to export to another circuit, access by a processor, transmit the data to anther system, etc.

At 902, a decoder may receive an integer i in an encoded representation E(i). For example, the decoder may be configured to decode encoded representation of the integer E(i) into a fixed length code binary representation that represent $\beta_i$ based on an eight-bit scheme, sixteen-bit scheme, thirty-two-bit scheme, sixty-four-bit scheme, or other schemes such as one hundred and twenty-eight-bit schemes. In other examples, additional sized schemes may be utilized. The encoded representation can be received directly as an input to the decoder. Alternatively, it can be obtained from an unpacking unit.

At 904, the decoder may identify a FLH $P_i$ and a frustum $I_i$ associated with the encoded representation. For example, the fixed length header $P_i$ may be a fixed number of bits used to indicate the position of the LO in $\beta_i$. The frustum $I_i$ may represent the bits to the right of the LO of $\beta_i$.

At 906, the decoder may prepend a bit with a value of "1" (e.g., the LO) to the left of the frustum $I_i$. For example, the LO may be truncated from the encoded representation E(i). Thus, the decoder may decode the encoded representation E(i) to re-prepend the "1" to the left of the frustum $I_i$.

At 908, the decoder may determine a number of zeros based, at least in part, on the fixed length header, $P_i$. For example, $P_i$ may indicate a value representative of the position of the LO, and the decoder may determine the number of zeros to the left of the LO by taking the bit-wise inverse of the value that of $P_i$.

At 910, the decoder may prepend the number of zeros to the left of the frustum $I_i$ and the LO. For example, if the fixed length header $P_i$ represents the value eighteen (10010 in binary), the decoder may prepend thirteen (01101 in binary) zeros to the left of the LO.

At 912, the decoder may output the decoded representation or fixed length code binary representation of the integer i which represents $\beta_i$. For example, the decoder may output the decoded representation of the integer i to a main memory, cache, or other temporary memory, external component, various cache levels, processor or circuit, or to an external component or device.

Figure 10:
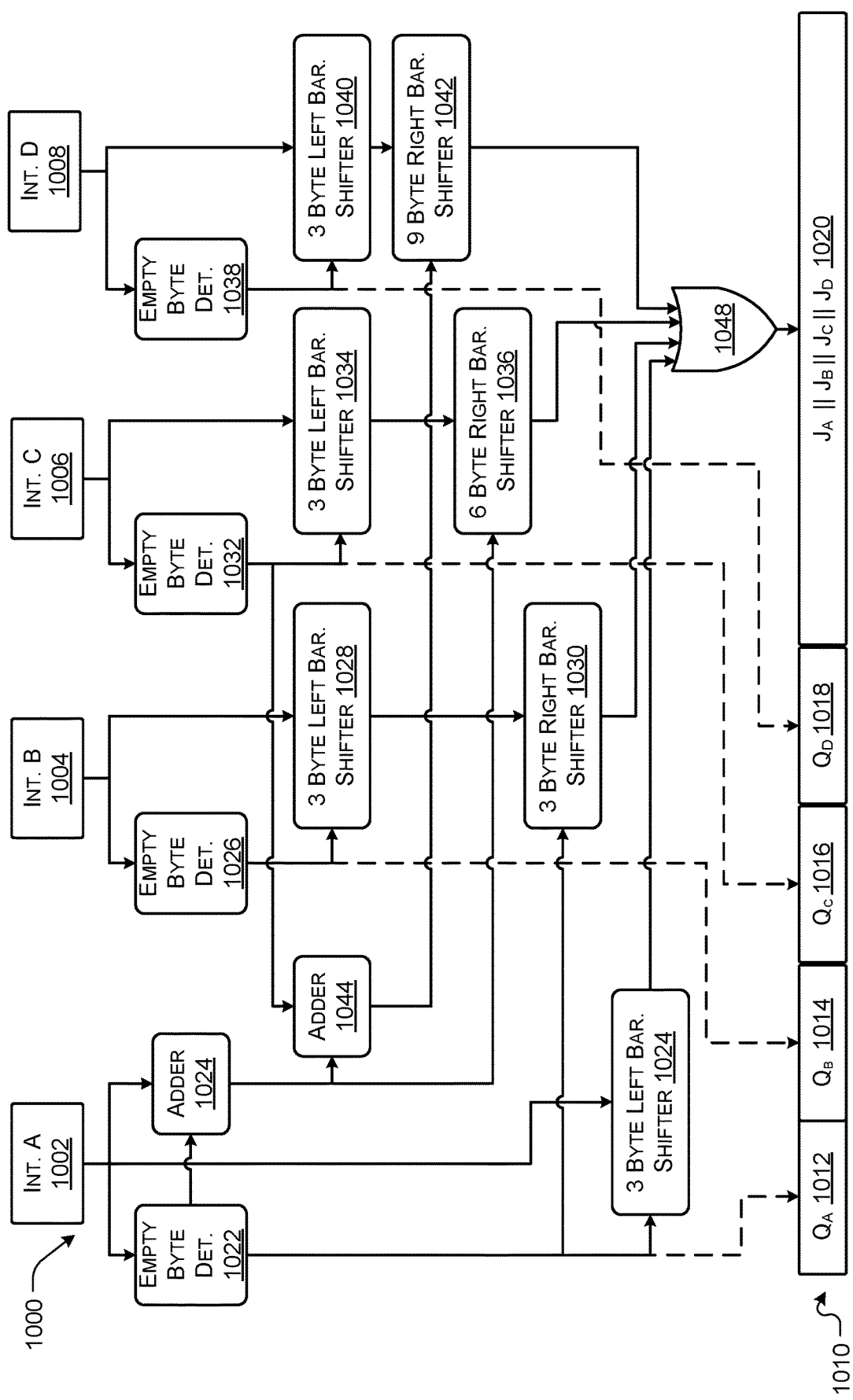
FIG. 10 illustrates a block diagram showing select components of example logic associated with a compression and packing system for performing compression of integers according to some implementations.

FIG. 10 illustrates a block diagram showing select components of example logic associated with a compression and pack system 1000 for performing compression of integers using SIGBYTES according to some implementations. In the current example, the compression system 1000 receives data-tokens as integers and using combinatorial logic detects if any of the bytes has all bits equal to zero. The system 1000 removes any zero value leading bytes and sets the fixed length header accordingly. For example, a portion of the fixed length header associate with each of the integers may be '00' if the three leading bytes have a value of zero, '01' if only the 2 leading bytes have a value of zero, '10' if only the most significant byte has a value of zero, or '11' if the most significant byte has a value different than zero.

The remaining bytes are concatenated to the fixed header to generate the encoded representation of the integer under the SIGBYTES encoding. Furthermore, compression system 1000 provides better efficiency if four integers, such as integers 1002-1008, are compressed and packed together, as shown. For example, the compression and pack system 1000 may combine the fixed headers of each of the integers 1002-1008 into one byte, followed by the variable number of byte necessary to represent the four integers as a compressed value, generally indicated by 1010. This is achieved by working with the described zero value leading byte detection system in parallel on the four integers 1002-1008 and concatenating the four fixed length headers, 1012-1018, and the associated bytes $J_A \| J_B \| J_C \| J_D$, generally indicated by 1020, for each of the integers 1002-1008. The compressed value 1010 may be achieved by a set of left shifters controlled in part by the fixed length header of each of the integers and their combination.

In the illustrated example, four integers A, B, C, and D 1002-1008 may be compressed and packed together. With respect to integer A 1002, the integer A 1002 is provided to an empty byte detector 1022 and a byte left barrel shifter 1024. The byte left barrel shifter 1024 also receives the output of the empty byte detector 1022 as a control input, such that the byte left barrel shifter 1024 may align $J_A$ for formation of $J_A \| J_B \| J_C \| J_D$ 1020.

With respect to integer B 1004, the integer B 1004 is provided to an empty byte detector 1026 and a byte left barrel shifter 1028. The byte left barrel shifter 1028 also receives the output of the empty byte detector 1026 such that the byte left barrel shifter 1028 removes any leading zero bytes (e.g., the empty bytes) from the integer B 1004 and forms $J_B$. The output of the byte left barrel shifter 1028 is received as a data input to a byte right barrel shifter 1030 and the output of the empty byte detector 1022 receives a control input, such that the byte right barrel shifter 1030 aligns $J_B$ for formation of $J_A \| J_B \| J_C \| J_D$ 1020.

Likewise, with respect to unpacking and decoding the integer C 1006, the integer C 1006 is first provided to an empty byte detector 1032 and a byte left barrel shifter 1034. The byte left barrel shifter 1034 also receives the output from the empty byte detector 1032 as a control input such that the integer C 1006 removes any leading zero bytes (e.g., the empty bytes) the integer C 1004 and forms $J_C$. The output of the byte left barrel shifter 1034 is proved as a data input to a byte right barrel shifter 1036. The byte right barrel shifter 1036 also receives the output of the adder 1024 as a control input such that the byte right barrel shifter 1036 aligns $J_C$ for formation of $J_A\|J_B\|J_C\|J_D$ 1020.

With respect to unpacking and decoding the integer D 10086, the integer D 1008 is first provided to an empty byte detector 1038 and a byte left barrel shifter 1040. The byte left barrel shifter 1040 also receives the output from the empty byte detector 1038 as a control input such that the integer D 1008 removes any leading zeros (e.g., the empty bytes) the integer D 1008 and forms $J_D$. The output of the byte left barrel shifter 1040 is proved as a data input to a byte right barrel shifter 1042. The byte right barrel shifter 1042 also receives the sum of the output of adder 1024 and the empty byte detector 1026 from an adder 1044 as a control input such that the byte right barrel shifter 1042 aligns $J_D$ for formation of $J_A\|J_B\|J_C\|J_D$ 1020.

The outputs of the barrel shifters 1024, 1032, 1036, and 1042 are provided to a plurality of OR gates, indicated by gate 1048, to perform OR operations on, for instance, four busses associated with the output of the barrel shifters 1024, 1032, 1036, and 1042 to generate $J_A\|J_B\|J_C\|J_D$ 1020 which is stored together with the $Q_A$, $Q_B$, $Q_C$, and $Q_D$ 1012-1018. The values of $Q_A$, $Q_B$, $Q_C$, and $Q_D$ 1012-1018 may be generated based at least in part by an output of each of the respective empty byte detectors 1022, 1026, 1032, and 1038, generally indicated by the dotted arrows. For example, the value of $Q_A$ 1012 may be the one's complement of the output of the empty byte detector 1022, the value of $Q_B$ 1014 may be the one's complement of the output of the empty byte detector 1026, the value of $Q_C$ 1016 may be the one's complement of the output of the empty byte detector 1032, and the value of $Q_D$ 1018 may be the one's complement of the output of the empty byte detector 1038. It should be understood that the length of the encoded representation is variable and is based on the length of $J_A\|J_B\|J_C\|J_D$ 1020.

Figure 11:
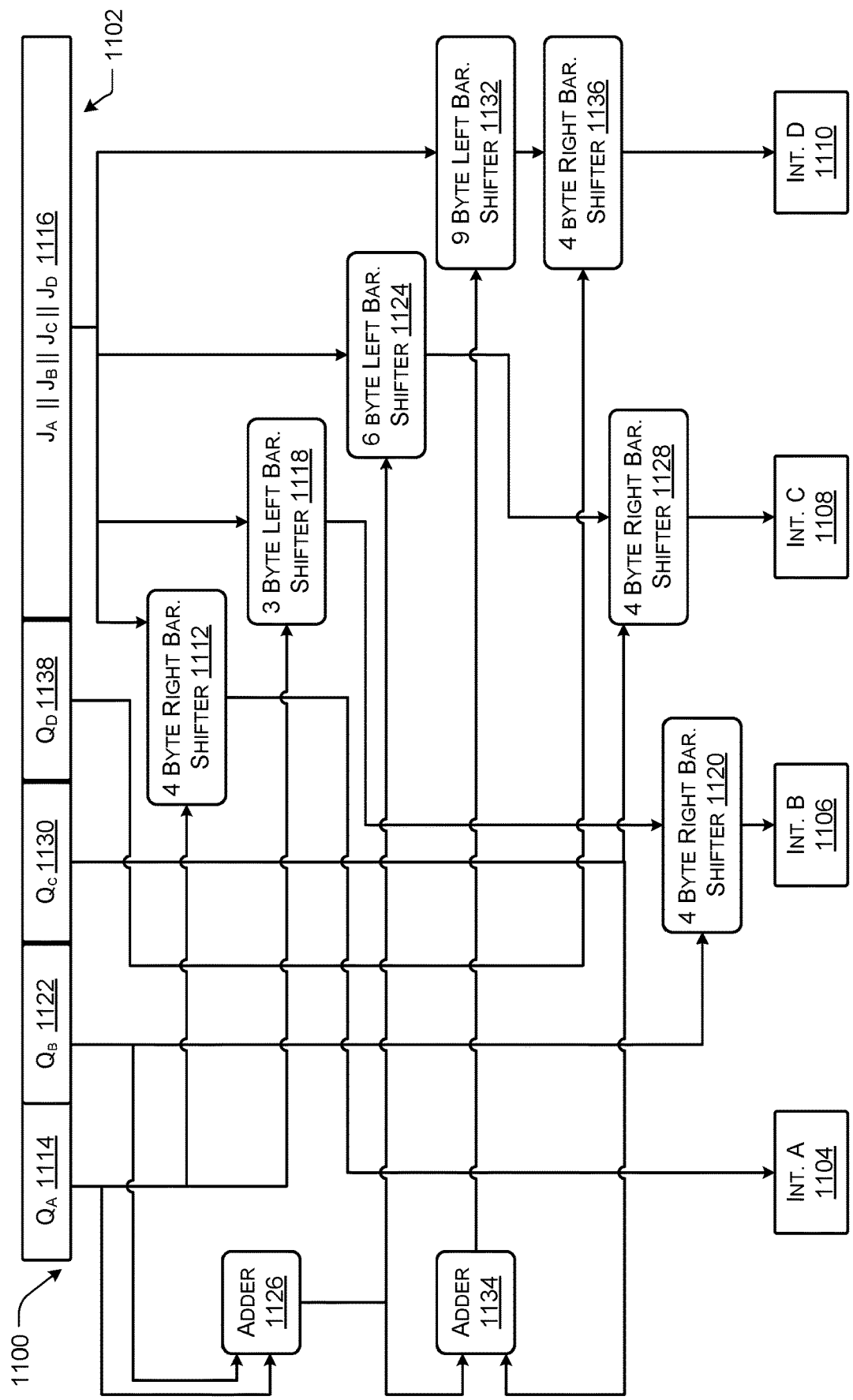
FIG. 11 illustrates a block diagram showing select components of example logic associated with a decompression and unpacking system for performing decompression of integers according to some implementations.

FIG. 11 illustrates a block diagram showing select components of example logic associated with a decompression and unpack system 1100 for performing decompression of integers using SIGBYTES according to some implementations. In this example, integers have been compressed and packed in sets of four, however, it should be understood that any number of integers (including single integers) may be compressed and packed together. The decompression system 1100 receives a compressed and packed set of integers (four integers in this example) and based on the fixed length headers portions ($Q_A$, $Q_B$, $Q_C$, and $Q_d$) of each integer, which are stored as one header byte containing $\{Q_A\|Q_B\|Q_C\|Q_D\}$, restitute the zero value leading bytes that were removed in the compression process discussed above with respect to FIG. 10 by shifting the compressed integer representation bytes right by the appropriate number of bytes. For fixed length header value of '11' no shift is required, for fixed length header of '10', one-byte shift right is required, for a fixed length header of '01', two-byte shifts right are required and for the fixed length code of '00', three-byte shifts right are required. The shifter output is the 32-bit fixed length binary representation of the encoded integer.

Furthermore, since SIGBYTES encoded integers may be compressed and packed in sets of four, as shown above with respect to FIG. 10, the decompression system 1100 may accept one or more packed blocks 1102 of integers. In the current example, the unpack unit may receive a block 1102 of 4 compressed integers 1104-1110. However, it should be understood that in other examples, the number of integers in a block 1102 may vary.

In the present example, the four compressed integers A, B, C, and D, 1104-1110 respectively, are stored as block $\{Q_A\|Q_B\|Q_C\|Q_D\|J_A\|J_B\|J_C\|J_D\}$ 1102. With respect to unpacking and decoding integer A 1104, a byte right shifter 1612 may receive $Q_A$ 1114 as a control input and the 4 left most bytes of $J_A\|J_B\|J_C\|J_D$ 1116 as a data input. The byte right shifter 1112 may shift $J_A\|J_B\|J_C\|J_D$ 1116 by 4 bytes to the right based in part on the value of $Q_A$ 1114 generating the integer A 1104, as shown.

Similarly, with respect to unpacking and decoding the compressed integer B 1106, $J_A\|J_B\|J_C\|J_D$ 1116 is first provided as a data input to a byte left barrel shifter 1118. The byte left barrel shifter 1118 also receives $Q_A$ 1114 as a control input such that the byte left barrel shifter 1118 is able to remove any bytes related to $J_A\|J_B\|J_C\|J_D$1116 and then the four left most bytes of the output are passed to a byte right shifter 1120 which also receives $Q_B$ 1122 as a control input. The byte right shifter 1120 may shift these four bytes to the right based in part on the value of $Q_B$ 1122 generating the integer B 1106.

Likewise, with respect to unpacking the compressed integer C 1108, $J_A\|J_B\|J_C\|J_D$1616 is first provided to a six-byte left barrel shifter 1124. The byte left barrel shifter 1124 also receives a value equal to $Q_A+Q_B$ from an adder 1126 as a control input such that the byte left barrel shifter 1624 is able to remove any bytes related to $J_A\|J_B$ from $J_A\|J_B\|J_C\|J_D$ 1616. The four left most bytes of the output of the byte left barrel shifter 1124 are passed to a byte right shifter 1128 which also receives $Q_C$ 1130 as a control input. The byte right shifter 1128 may shift these four bytes to the right based in part on the value of $Q_C$ 1130 generating the integer C 1108.

With respect to unpacking and decoding the compressed integer D 1110, $J_A\|J_B\|J_C\|J_D$ 1116 is first provided to a nine-byte left barrel shifter 1132. The byte left barrel shifter 1132 also receives a value equal to $Q_A+Q_B+Q_C$ from an adder 1134 as a control input such that the byte left barrel shifter 1632 is able to remove any bytes related to $J_A\|J_B\|J_C$ from $J_A\|J_B\|J_C\|J_D$ 1616. The four left most bytes of the output of the byte left barrel shifter 1132 are passed to a four-byte right shifter 1136 which also receives $Q_D$ 1138 as a control input. The four-byte right shifter 1136 may shift these 4 bytes to the right based in part on the value of $Q_C$ 1138 generating the integer C 1110.

Figure 12:
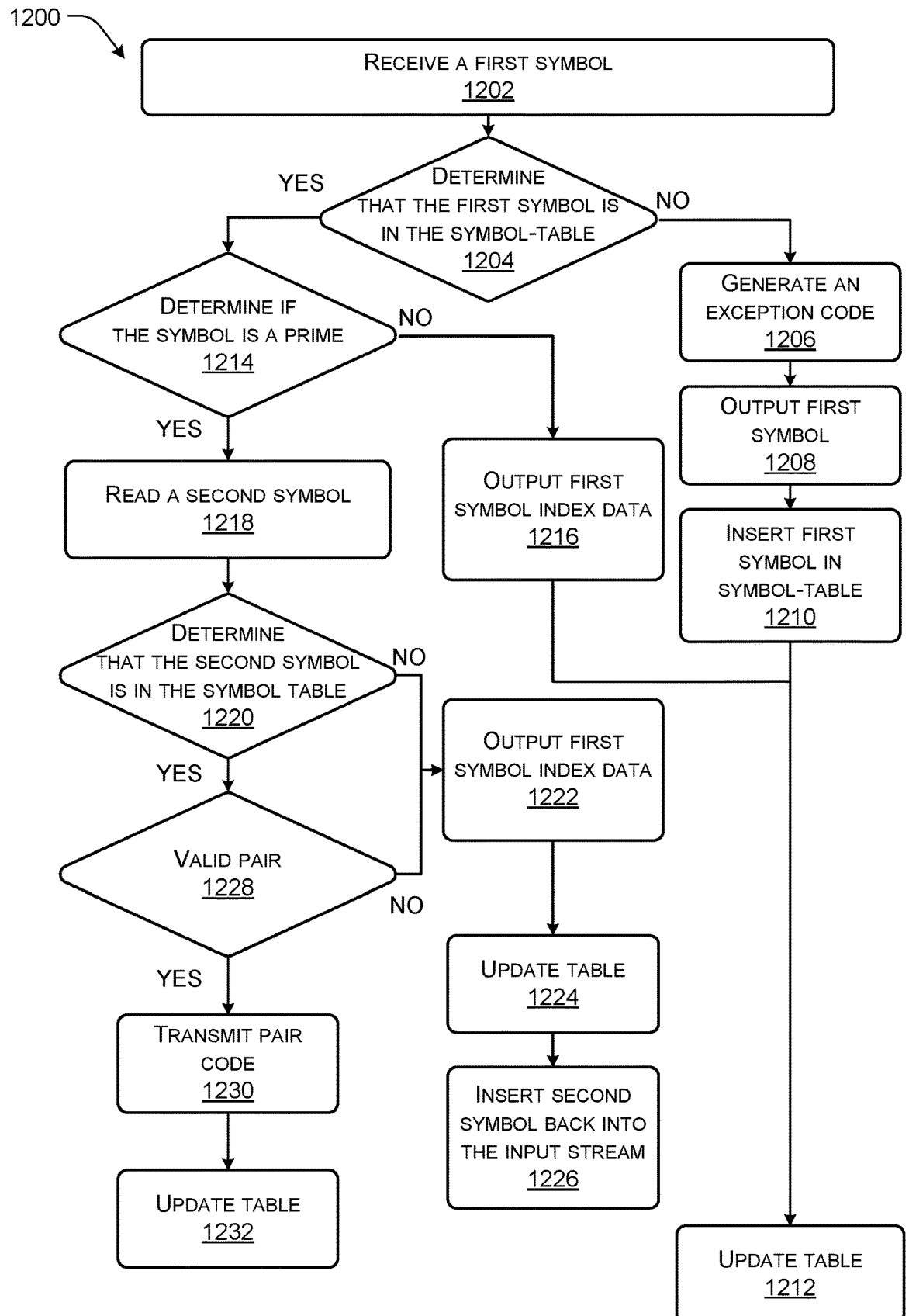
FIG. 12 is example flow diagram showing an illustrative process for updating a symbol-table according to some implementations.

FIG. 12 is example state diagram showing an illustrative process 1200 for updating a dictionary referred to as a symbol-table according to some implementations. For example, each symbol might be a member of the ASCII set of characters or a member of the Unicode set of characters. In the implementation discussed herein, each symbol may represent a byte of data. In the illustrated example, logic associated with a compression system and a decompression system using a Dynamic dictionary compression method, referred to as LFLR is discussed. In the most general form, LFLR is a method of coding used for lossless data compression. Unlike variable-length codes, LFLR coding may map a variable set of source symbols to data elements with fixed number of bits. Thus, LFLR may represent variable-length input symbols using fixed-length code.

Variants of the LFLR approach might assume that the probability of occurrence of symbols is known to the encoder and the decoder and it does not change with time. These variants lend themselves to an implementation that use static dictionary. Instead, the system, discussed herein, utilize a dynamic approach which builds and manages the dictionary as symbols arrive.

Under the process 1200, a symbol-table might contain parts that are virtual; that is, the parts are implied by the process 1200 and do not require material implementation. Other parts of the dictionary are "real" and require physical implementation. Thus, the data stored in the symbol-table consist of symbols, symbol pairs, triples, and in general, topples of n-symbols where a topple of n-symbols is referred to as a string. The system may distinguish between two types symbol-table elements. The first set of elements contain prime strings. These strings serve as headers of other and can be appended by prime and by non-prime strings. The second type of strings is referred to as non-prime strings. Non-prime strings cannot be appended by any other string. The distinction between prime and non-prime strings as well as the determination of which string should be evicted from the table are managed via a combination of least recent and least frequent usage (LRU, and LFU). The LRU and LFU policy is enabled by two type of counters: a counter that reflects the number of times that an n-symbols topple has been used so far and a counter (the stale counter) that reflects the number of cycles that passed since the last usage of that element.

The symbol-table may include a value (e.g., a string) together with an associated a usage counter used to represent the frequency of usage of each symbol, a counter that holds the number of empty spaces in the table and a valid bit. In some cases, the value may be represented using eight bits. When a usage counter reaches a predetermined maximum value, the counter may be held or locked. In order to avoid a case where many counters are locked at max the system periodically decrease the value of each of the usage counters (e.g., by dividing the value of each counter by 2). Additionally, each entry in the table may be associated with a stale counter. Initially, each of the stale counters are set to 0. The stale counters may be incremented periodically by the system. When a stale counter of a specific entry reaches a predetermined threshold value, the counter may be locked and indicate a good table entry candidate for removal. For instance, a locked stale counter is a sign that the symbol stored in the corresponding entry has not been encountered for a period of time.

In the current process 1200, the table might contain only single symbols and pairs of symbols, however, it should be understood that any number or sequence of characters may be stored as a string entry in the symbol-table. At 1202, a byte (for instance, a symbol) arrives at the system. In this example, each symbol, represented by a unique combination of 8-bits, is a unique byte and each unique byte is a symbol.

At 1202, a first symbol arrives at the system. In this example, the system may receive symbols or pairs of symbols. However, it should be understood in various implementations, that the system may be configured to process n-symbol strings.

At 1204, the system may determine if the symbol is present or exists in the symbol-table. For example, the symbol may be compared against each valid entry in the symbol table, as discussed above.

If the symbol is not present in the symbol-table, the process 1200 proceeds to 1206 and the system generates an exception code followed by the FLC code of the symbol. After generating the exception code, the process may move to 1208 and the system may output the first symbol.

At 1210, the system may insert the first symbol into the symbol-table. For instance, the system may first check to see if the symbol-table has any available or empty entries (the value of the Valid-bit in these entries is 0). If so the system may insert the first symbol into one of these entries in the symbol-table. If, however, the table is full. The system may next attempt to increase the size of the table (for example, by doubling the size or multiplying by 2). If the symbol-table size is increasable, then the system may insert the first symbol into the symbol-table via one of the newly created entries and initialize a usage counter and a stale counter associated with the entry Additionally, the system sets the value of the valid bit to 1. If, however, the symbol-table is at a maximum size allowed by the implementation, the system may select an entry in the table to be evicted or removed. In various examples, the system may select the entry that has the largest stale counter and/or the entry that has the lowest usage counter and/or a combination thereof. For instance, a stale counter greater than a first threshold and a usage counter less than a second threshold.

Following the insertion of the symbol to the symbol-table, the process 1200 advances to 1212. At 1212, the system updates the table. That is, the system may set a valid bit associated with the first symbol entry in the symbol-table to 1 (or true), set a usage counter associated with the first symbol entry in the symbol-table to one, set a stale counter associated with the first symbol entry in the symbol-table to zero (or set a table bit to false), and/or update a global table counter (e.g., a counter representing the number of valid entries in the symbol-table) to account for the newly added the entry.

If, at 1204, the system determines that the first symbol is in the symbol-table, the process 1200 advances to 1214. At 1214 the system determines if the symbol is a prime. If the symbol is not a prime, the process 1200 proceeds to 1216. At 1216, the system may output the first symbol index data and move to 1212 to update the symbol-table, as discussed above.

If, however, the symbol is a prime, the process 1200 proceeds to 1218. At 1218, the system reads a second symbol (e.g., the next symbol). At 1220, the system determines if the second symbol is in the symbol-table. If the second symbol is not in the symbol-table, the process 1200 advances to 1222 and the system output the first symbol index data. At 1224, the system then updates the table (e.g., update the counters associated with the first symbol)). At 1226, the system may re-insert the second symbol into the input stream and process the second symbol as a newly read symbol from the input stream (e.g., the system processes the second symbol as a new first symbol). In this example, the system may start the process 1200 over with the second symbol.

However, if the second symbol is in the symbol-table, the process 1200 proceeds to 1228. At 1228, the system determines if the first and second symbol are a valid pair, that is they are available in the virtual table. If the two symbols are not a valid pair, the process 1200 returns to 1222. If the two symbols are a valid couple, the process 1200 advances to 1230. At 1230, the system may transmit a pair code and, at 1232, the system may update the singletons and the pair table. For instance, the system may update the valid bit, stale counter, and usage counter associated with the couple.

A prime update and a Table refresh may be triggered by the system periodically or continuously. A table refresh may be enacted when the table is full for a given quantum of time and is up to its implementation limitation. In this case, the table is reduced by marking the lower half portion of the table as invalid. A prime update may occur when a symbol usage counter value is higher than the usage counter value of at least one of the current prime symbols.

LFLR is a dynamic process. In some examples, as the encoder state (e.g., setting of counters) changes, the decoder should be in full synch with the new state. In LFLR The encoder and the decoder work dynamically in tandem; in the following way. As described above, the encoder uses the current symbol-table to make a decision about the next code to be transmitted. Next, the encoder sends the code to the decoder and updates the table. On the other hand, the decoder receives the code and uses the current table to encode this code. Next the decoder updates its own table and state in a way that ensures synchronization. Hence, the decoder is synchronized with the encoder. Note that the operations performed by the decoder for each step are almost identical to the steps performed by the encoder at that step. For example, the insertion into the table and the table update operations performed by the decoder are identical to the insertion into the table and table update operations performed by the encoder.

Figure 13:
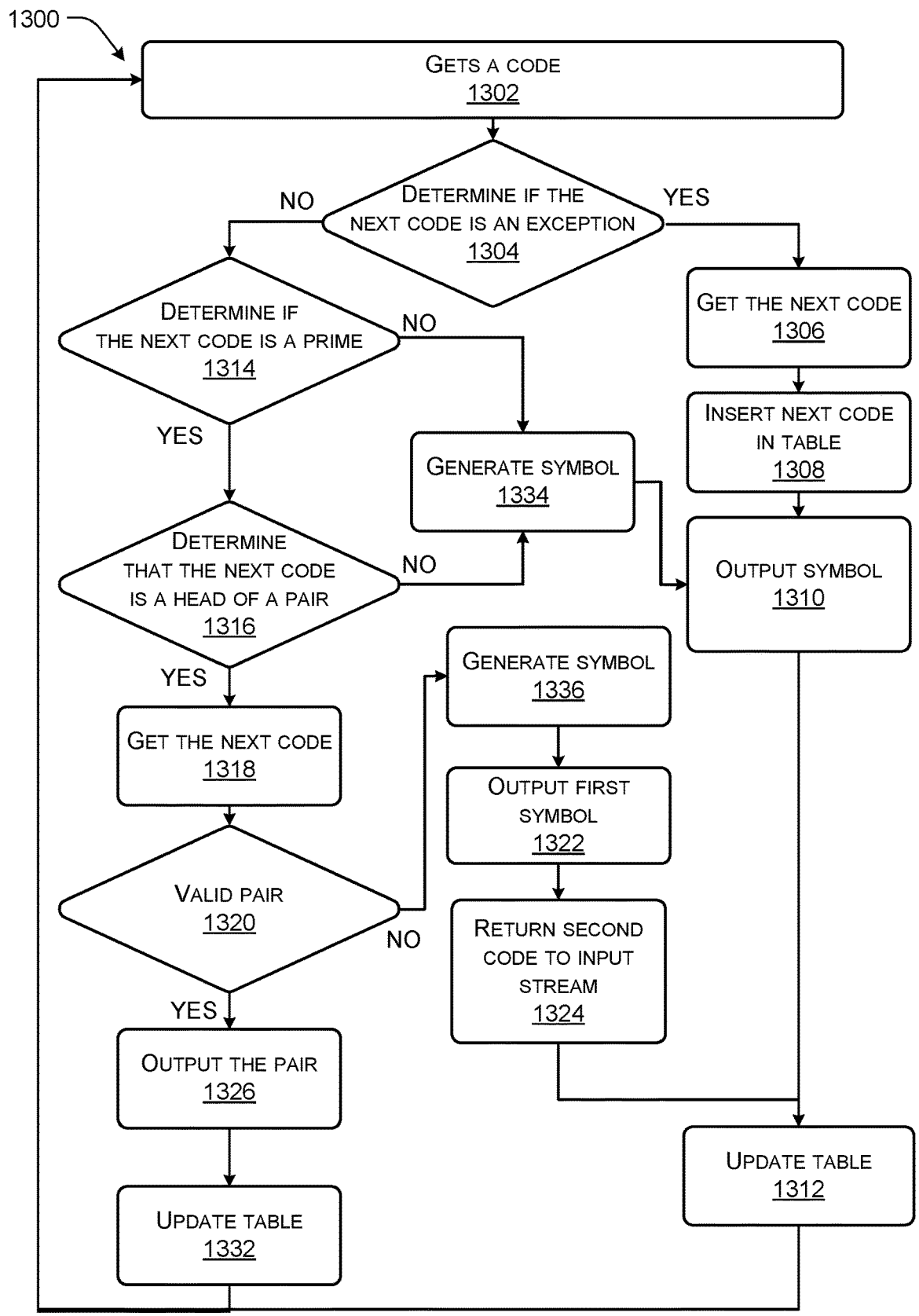
FIG. 13 is an example flow diagram showing an illustrative process for decoding symbols according to some implementation.

FIG. 13 illustrates a flow diagram showing an illustrative process 1300 for decoding LFLR symbols according to some implementation. At 1302, a decoder system gets a code and, at 1304, the decoder system checks whether or not the code is an exception. If the code is an exception, the process 1300 proceeds to 1306. At 1306, the system may get the next code, which is actually a symbol that was sent to an encoder (for example as discussed above with respect to FIG. 12).

At 1308, the system may insert the symbol into Table. In this example, the Table is a table representing symbols stored as singletons. Next at 1310, the decoder system may output the symbol and, at 1312, updates the Table. The system may then return to 1302 and get a new code.

If at 1304, there was not an exception, the process 1300, advances to 1314. At 1314, the decoder system determines if the code is prime. If the code is not a prime, the process 1300 moves to 1334 and generates a symbol from table value associated with the code. Next, the process 1300 moves to 1310 and the decoder system outputs the symbol. The system then proceeds to 1312 and updates the Table and returns to 1302.

If the code is prime, the process 1300 moves to 1316 and the decoder system determines if the code is a head of a pair. If the code is not a head of a pair, the process 1300 advances to 1334 and generates a symbol from table value associated with the code. Next, the process 1300 moves to 1310, 1312, and retunes to 1302 as discussed above.

If, however, the code is the head of a pair, the process 1300 advances to 1318. At 1318, the decoder system get the next code. At 1320, the decoder system may determine if the next code and the code are a valid pair. If the two codes are not a valid pair, the process 1300 moves to 1336 and the system generates a symbol from a value associated with the code. At 1322, the decoder system output the first code (e.g., a symbol). At 1324, the decoder system returns the second code to the input stream. After returning, the second code to the input stream, the process 1300 may move to 1312 and update table.

If the code and the second code are a valid pair, the process 1300 moves to 1326. At 1326, the decoder system generates the pair symbols associated with the code of the pair and output the pair symbols. At 1328, the decoder system updates the Table for each member of the pair and, in some, cases the system may optionally update a Pair Table. Then the process 1300 returns to 1302 and the system gets another code.

It should be understood that the process 1300 may continue as long as there are codes within the input stream and the decoder system is able to get the next code.

FIG. 14 is a diagram showing an example state machine 1400 associated with receiving a symbol according to some implementations. In this example, the state machine 1400 includes an IDLE state 1402 prior to receiving an input byte, which is denoted by a signal 'Valid' at the read byte state. The state machine 1400 also includes a compare state (CAM1) 1404 to compare the received byte with the table. If the state machine 1400 fails to find a hit (or match) in the table, the state machine 1400 may transition to the byte not in table state (TXEXC) 1406 and issue an exception code and transmit the fixed length code of symbol. In some cases, the state 1406 may cause the byte to be added to the symbol-table via the update symbol-table action. If the byte is not in table state (TXEXC) 1406, the system may also update various counters (such as usage and stale counters), valid bits, and one or more global counters (such as a global table size counter).

Alternatively, if the state machine 1400 finds a hit in the table at the compare state (CAM1) 1404, the state machine 1400 may transition to a type of hit state (TYPOFHIT) 1408. If the state machine 1400 determines that the type of hit is a couple (pair) head (or prime) byte, the state machine 1400 moves to a read byte state (RDBYTE) 1410 and reads a second byte from the input stream. If the second byte is valid at the read byte state (RDBYTE) 1410, the state machine 1400 transition to a compare state (CM2) 1412. In the state 1412, the state machine 1400 determines if the second byte is in the symbol-table. If the second byte is in the symbol-table, the state machine 1400 moves to valid pair state (ISLEGCPL) 1418. In the state 1418 the state machine 1400 identifies if the first and second bytes are a valid pair (or couple). If the first and second byte are a valid pair, the state machine 1400 advances to transmit pair code state (TXCPL) 1420 and transmits the pair code (or couple code) and updates the table.

Alternatively, if in state 1408, the state machine 1400 determines that the type of hit is not prime, the state machine 1400 transitions to transmit code state (TX1) 1414 and the state machine 1400 outputs the first byte (or an index to the first byte in the symbol-table). In the state machine 1300, at various states the system may run a first update routine (generally referred to as update Table 1) and a second update routine (generally referred to as update Table 2) that process a different update action depending on whether they update the table with a new symbol and have to insert the new symbol to the table or whether updating an entry of existing table singleton or the two members of a pair.

In another alternative, in the state 1410, if the second byte is not valid, the state machine 1400 moves to transmit code state (TX2) 1416. In state 1416, the state machine 1400 may output the first byte (or an index to the first byte in the symbol-table).

In yet another alternative, if in the state 1412 the second byte is not in the symbol table, the state machine advances to transmit code state (TX3) 1422. In the state 1422, the state machine 1400 may transmit the first byte (or an index to the first byte in the symbol-table).

In yet another alternative, if in the state 1418, the first and the second byte are not a valid pair, the state machine moves to transmit code state (TX4) 1424. In the state 1424, the state machine 1400 may transmit the first byte (or an index to the first byte in the symbol-table) and update the symbol-table (for example, various counters may be updated). The state machine 1400 then advances to transmit code state (TX5) 1426 and the state machine 1400 may send the second byte (or an index to the second byte in the symbol-table.).

Figure 15:
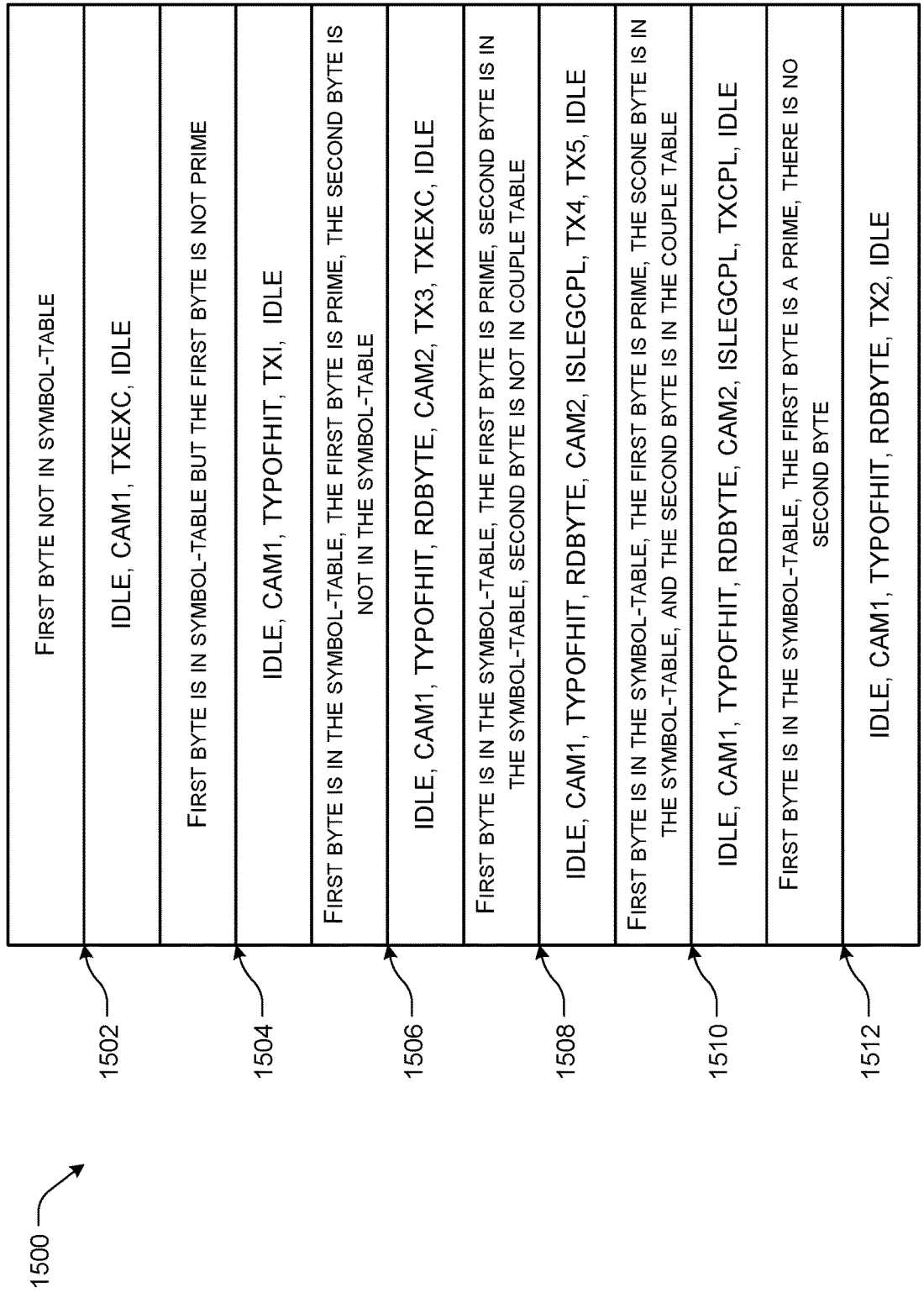
FIG. 15 illustrates example flows of the state machine of FIG. 14.

FIG. 15 illustrates example flows of the state machine 1400 of FIG. 14. For instance, in 1502, a first byte that is not in the symbol-table may be received as an input to the state machine 1400. In this instance, the state machine 1400 proceeds through the states IDLE 1402, CAM1 1404, TXEXC 1406, and IDLE 1402.

Alternatively, in 1504, the first byte is in the symbol-table but the first byte is not prime (or a couple head). In this alternative, the state machine 1400 may transition through the states IDLE 1402, CAM1 1404, TYPOFHIT 1408, TX1 1414, and IDLE 1402.

In another alternative 1506, the first byte may be in the symbol-table and the first byte may be prime, but the second byte may not be in the symbol-table. In 1506, the state machine 1400 may move through the states IDLE 1402, CAM1 1404, TYPOFHIT 1408, RDBYTE 1410, TX3 1422, TXEXC 1406, and IDLE 1402.

In yet another alternative 1508, the first byte may be in the symbol-table and prime and the second byte may be in the symbol-table but not in the couple table. In 1508, the state machine 1400 may move through the states IDLE 1402, CAM1 1404, TYPOFHIT 1408, RDBYTE 1410, CM2 1412, ISLEGCPL 1418, TX4 1424, TX5 1426, and IDLE 1402.

In yet another alternative 1510, the first byte may be in the symbol-table and prime and the second byte may be in the symbol-table and in the couple table. In 1510, the state machine 1400 may move through the states IDLE 1402, CAM1 1404, TYPOFHIT 1408, RDBYTE 1410, CM2 1412, ISLEGCPL 1418, TXCPL 1420, and IDLE 1402.

In still another alternative 1512, the first byte may be in the symbol-table and prime and the second byte does not exist in the input stream. In 1512, the state machine 1500 may move through the states IDLE 1402, CAM1 1404, TYPOFHIT 1408, RDBYTE 1410, TX2 1416, and IDLE 1402.

Figure 16:
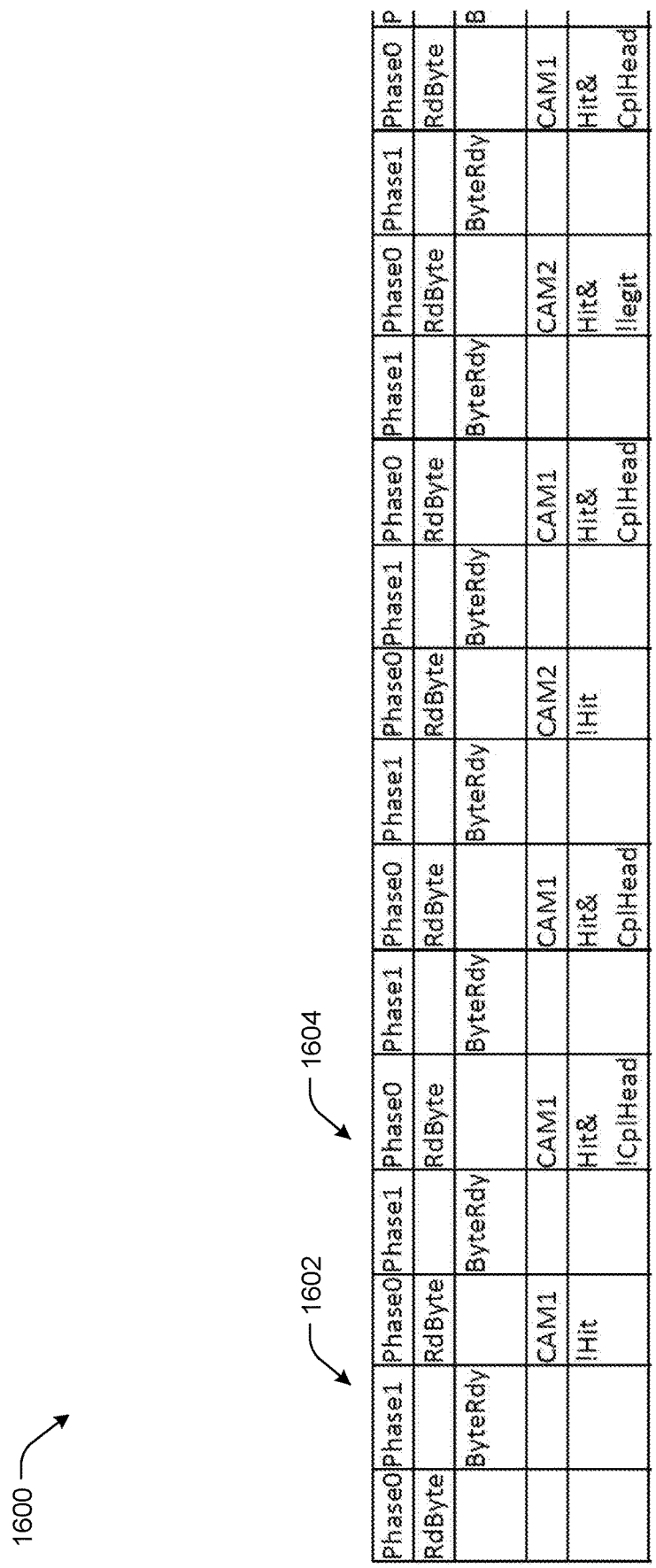
FIG. 16 is a diagram showing an example timing diagram associated with receiving a symbol according to some implementations.

FIG. 16 is a diagram showing an example pipelined timing diagram 1600 associated with receiving symbols according to some implementations. For example, the timing diagram 1600 shows the state of the state machine 1400 discussed above as a timing signal alternating between a first phase 1602 and a second phase 1604. The timing diagram 1600 illustrates examples of consecutive inputs to the state machine 1400 and may be used to assess the latency associated with the possible consecutive inputs.

Figure 17:
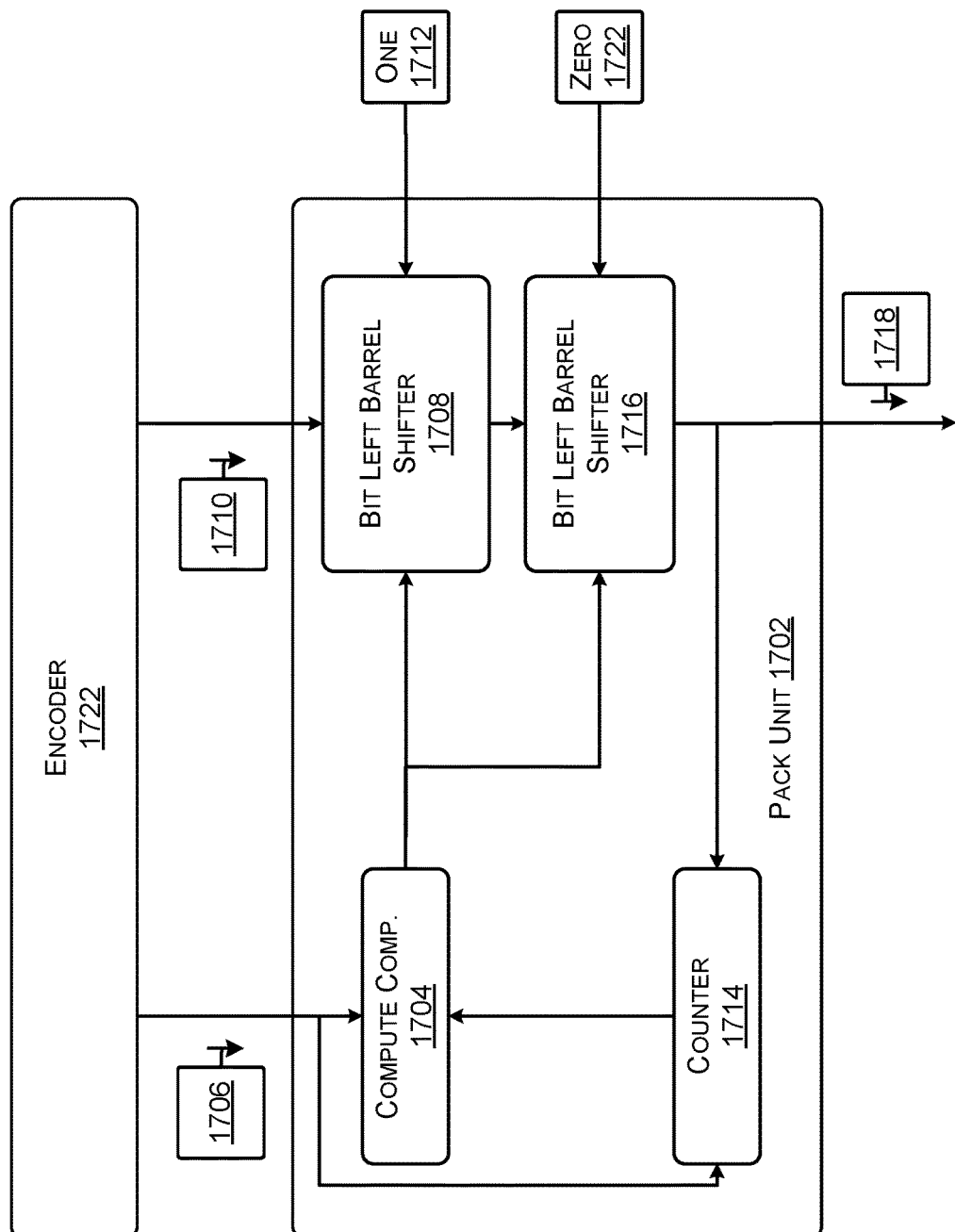
FIG. 17 illustrates an example system including a pack unit for use with packing data-tokens according to some implementations.
Figure 18:
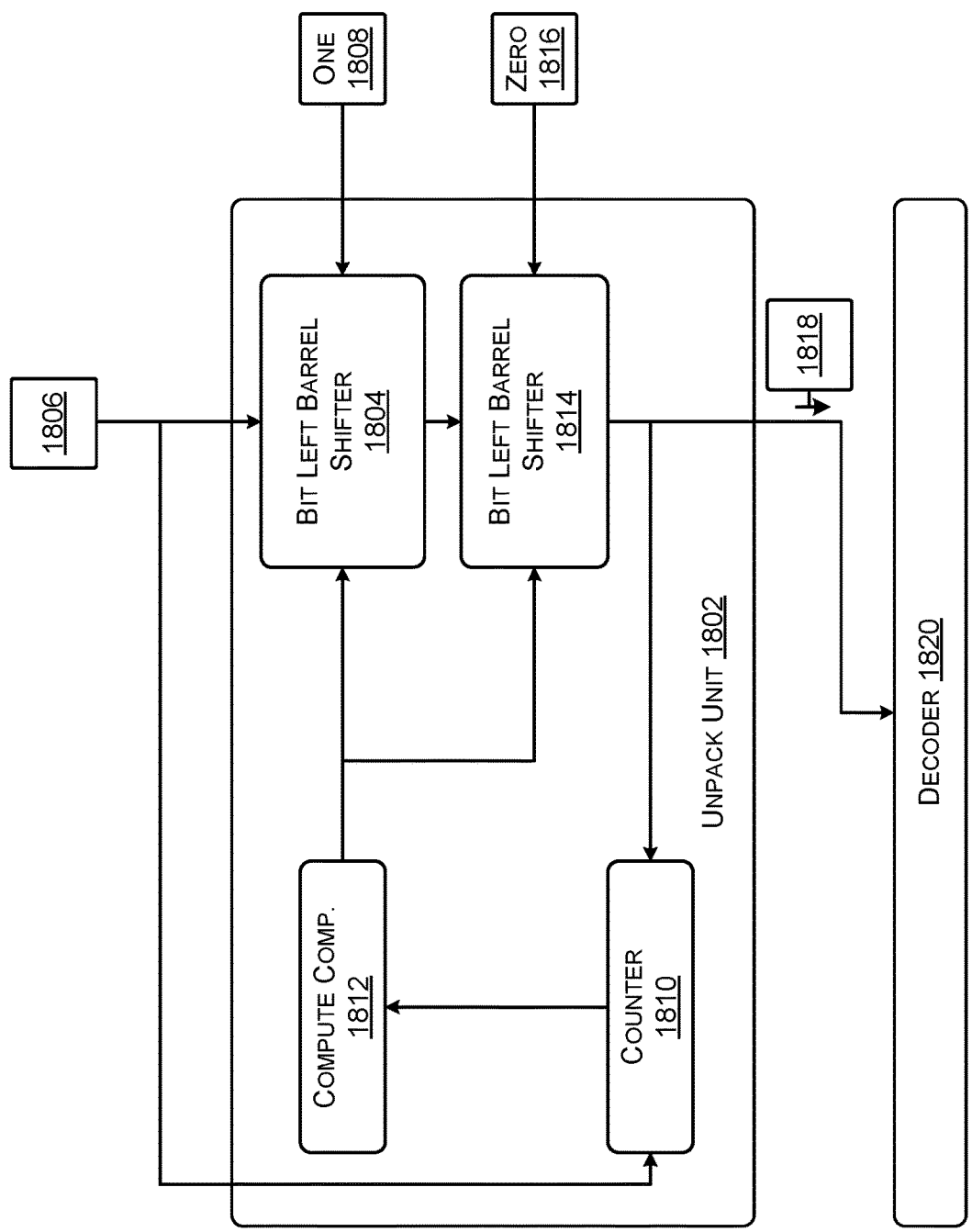
FIG. 18 illustrates an example system including an unpack unit for use with packing data-tokens according to some implementations.

In the SIGBITS and SIGBYTE examples above the compression and pack and decompression and unpack are performed in conjunction with each other. However, in some cases, such as LFLR discussed below, pack and unpack may be performed independently or by separate components from the compression and decompression. FIGS. 17 and 18 provide example pack and unpack units that may be used with various compression techniques including LFLR.

In these examples, packing may be performed after the encoding. The task of the pack unit is to receive code-words of variable length generated by the encoder, pack the code-words into consecutive bytes, and output the byte stream, potentially through a bus, to the next system unit. The pack unit may use a buffer, where the encoder inserts code-words and a counter that keeps track on the number of bits (hence, the number of bytes) in the buffer. In general, the buffer size should be at least two times larger than the system bus size and large enough to include at least two code words. Table 1 below illustrates the process executed by the pack unit.

TABLE 1

| Bytes in buffer | 0 | 1 | 2 | 3 | 4 | 5 | 6 | 7 | 8+ |
|---|---|---|---|---|---|---|---|---|---|
| Action | Wait | Wait | Wait | Wait | Wait | Wait | Wait | Wait | Out |

In the present example, the system may operate on 64 byte and 128 byte strings. The pack unit enact a set of pack action based on the number of bytes in the counter. This number is obtained by integer division by eight, of the number of bits in the buffer, which is stored in the counter. The division, however may be done via a shift left by three or through table lookup. In Table 1, 'Bytes in Buffer' denotes the number of meaningful bytes (i.e., bytes that contain code-words) currently stored in the buffer. For example, 0 means that there is less than one byte (0-bits to 7-bits) in the buffer, and 1 means that there is at least one byte but less than two bytes. The number 8+ means that there are either 8-bytes of data, or more than 8-bytes of data, in the buffer. Furthermore, 'Wait' means wait for the encoder to place a new code-word into the buffer, and 'Out' means: output the eight most significant bytes, left shift the buffer content by 8-bytes, and update the counter by subtracting 64 from the value stored in the buffer. It should be noted that other configurations of buffer/bus sizes as well as other units of data size (e.g., nibbles or bits) can be considered. In some embodiments, the encoder sends code-words and their respective size to the pack unit. Alternatively, the encoder may send only the code-words to the pack unit. As another alternative, the encoder sends a fixed number of bits per transaction, for example, 64 bits, provided that these bits contain at least one left adjusted code word.

The pack unit uses the counter to determine where to append new code-words in the buffer. This is described in FIG. 17, below, and may be done using a barrel shifter that shifts the code-word to the left so that it is inserted in the first available place in the buffer. Additionally, the pack unit updates the counter after placing a code-word or fixed length block. In some compression systems, however, the pack unit is placed within the encoder as this may eliminate redundant operations, reduce the number of system units, and lessen communication overhead. Note, that it is possible to pipeline the encoding of data-token I with the packing of data-token I–1. This can enable working in parallel on more than one data-token and pipelining more than one buffer.

In some cases, Table 1 can be implemented via a state machine with two states 'Wait', and 'Out'. In the Wait state the system waits (or stays in the Wait state) until there are at least eight bytes of data in the buffer. In the out state, the system may output the eight most significant bytes, left shift the buffer content by 8-bytes, and update the counter by subtracting 64 from the value stored in the buffer. Table 2 illustrates this state machine:

TABLE 2

| Current state | Next State when byte counter value is less than eight | Next State when byte counter value is eight or more than eight |
|---|---|---|
| Wait | Wait | Out |
| Out | Wait | Out |

Unpacking may be done before decoding. The task of the unpack unit is to receive enough data so that the unpack unit may determine if the data contains at least one encoded code-word to unpack the code-word when it is available, and send to the decoder. That is, to isolate the left most code-word and send the left most code-word to the decoder. Alternatively, the unpack unit might place the left most code-word at the left most part of the buffer and send the buffer or a fixed part of the buffer that contains at least one code-word to the decoder. In some compression systems, however, the unpack unit is placed within the decoder as this may eliminate redundant operations reduce the number of system units, and lessen communication overhead.

In some cases, the system may include a buffer where the system inserts code-words bits and a counter that keeps track on the number of bits (hence the number of bytes) in the buffer. The number of bytes is derived via integer division by eight of the counter value and may be implemented with shift left by three or via look-up tables. In general, the buffer size should be at least two times larger than the system bus size and large enough to include at least two code-words. Table 3, below, may serve as an illustration of the process for a set of unpack actions based on the number of code-words in the buffer.

TABLE 3

| Code-words in the buffer | 0 | 1+ |
|---|---|---|
| Action: 'bring k bytes' or Decode (Dec) | In | out |

In the current example, eight bytes contain at least one code-words. The system places eight bytes into a buffer with a size of at least 16-bytes. This is done using a barrel shifter that shifts these bytes to the left so that they are inserted in the first most left place available in the buffer. Additionally, the system updates the counter, by incrementing its value by 64. Next, the system identifies the left most code-word in the buffer. For many compression methods, however, it involves finding the leading bit of one in the data and this can be accomplished using a priority encoder. Next, the system checks how many code-words are left in the buffer and act according to the table. The number of code-words in the buffer may be less than one (denoted as 0). Alternatively, the buffer may contain more than one code-word and this is denoted as (1+) in Table 3. In the table, 'In' means bringing 64 bits from the system placing these 64-bits into the buffer. This is done using a barrel shifter that shifts these bytes to the left so that they are inserted in the first most left place available in the buffer. Additionally, or 'In' operation the system updates the counter, by incrementing its value by 64 it may include may re-initializing buffers and barrel shifters. 'Out' means output 64 bits (in some systems) or one code-word, potentially along with the size of the code-word. At the end of an Out operation the counter is updated by subtracting the size of the code-word just transmitted and subtraction of the size of this code word from the counter.

In some cases, Table 3 may be implemented as a state machine with two states 'In', and 'Out'. In the 'In' state the system brings at least one code-word into the buffer. In the out state the system: outputs the left most code-word potentially left aligned in 8-bytes data and potentially along with its size, left shifts the buffer content by 8-bytes or by the size of the code-word, and updates the counter by subtracting 64 or subtracting the code-word length from. Table 4 illustrates this state machine:

TABLE 4

| Current state | Next State when byte counter value is less than eight | Next State when byte counter value is eight or more than eight |
|---|---|---|
| In | In | Out |
| Out | In | Out |

It should be noted that other configurations of buffer/bus sizes as well as other units of data size (e.g., nibbles or bits) can be considered. In some compression systems, the unpack unit is placed within the decoder as this might reduce the number of system units and their communication overhead. Note, that it is possible to pipeline unpacking of code-word I with the decoding of-token I−1. This can enable working in parallel on more than one code-word and pipelining more than one buffer FIG. 17 illustrates an example system 1700 including a pack unit 1702 for use with packing code-words according to some implementations. In this example, the pack unit 1702 may be utilized to pack symbols encoded using various compression techniques, including LFLR. In general, the pack unit 1702 may receive from an encoder 1722 a code-word size 1706 and a code-word 1710. Alternatively, the pack unit may receive only code-words from the encoder and has to find their sizes. In another alternative, such as in LFLR the size of code-words is fixed and is available to the pack unit. The code-word size 1706 may be received at a compute component 1704 and the code-word 1710 may be received at a bit left barrel shifter 1708. In the example, the code-word size 1706 may be up to 64 bits.

Initially, the counter 1714 may be set to 0, the bit left barrel shifter 1708 may maintain a value that only contains "1" values, and the bit left barrel shifter 1716 may maintain a value that only contains "0" values. Following the initialization the code-word 1710 may be inserted into the right most part of the bit left barrel shifter 1708 and the counter 1714 may be updated by adding the value of the size 1706 to its contents. Next, the value maintained by the bit left barrel shifter 1708 may be shifted left by inserting one bit with a value of "1" 1712 per shift. The number of shifts may be equal to the size of the bit left barrel shifter 1708 minus the value of the counter 1714. Next, the value maintained by the bit left barrel shifter 1708 may go through a bitwise AND operation with a value maintained by the bit left barrel shifter 1716. At the same time, the bit left barrel shifter 1708 may be set to maintain a value that only contains "1" values.

When the counter 1714 has a value of 64 or more, the 64 most significant bits of the value maintained by the bit left barrel shifter 1716 may be used as output to external units such as memory or a communication channel as 1718. After outputting 1718, the coutner 1714 may be updated by subtracting 64 from its value and the value maintained by bit left barrel shifter 1716 may be shifted left by 64 with insertion of bits of '0' 1722 from the left. At the same time, the bit left barrel shifter may be updated to maintain a value that only contains "1" values. Next the system 1700 may commence with the operations that are following the initialization as described above.

FIG. 18 illustrates an example system 1800 including an unpack unit 1802 for use with unpacking code-words according to some implementations. In this example, the unpack unit 1802 may be utilized to unpack symbols encoded using various compression techniques, including LFLR. In this example, the unpack unit 1802 receives 64 bits 1806 of packed data at a bit left barrel shifter 1804. These bits might come from an external unit such as memory unit or from a transmitter.

Initially, the counter 1810 may be set to 64, the bit left barrel shifter 1804 may be set to maintain a value that only contains "1" values, and the bit left barrel shifter 1814 may be set to maintain a value that only contains "0" values.

Following the initiation, the 64 bits 1806 received are inserted in the right part of a value maintained by the bit left barrel shifter 1804. Next, the value maintained by the bit left barrel shifter 1804 may be shifted left by inserting a number of "1" at the right. The number of "1" being equal to 128 minus the value of a counter 1810.

Next, the value maintained by the bit left barrel shifter 1804 is bitwise AND with a value maintained by the bit left barrel shifter 1814. Next, a compute component 1812 identifies the boundary of the left most code-word in the value maintained by the bit left barrel shifter 1814. Next, the 64-bits that contain the left most code-word 1818 (or in some cases the actual code-word) potentially along with its size, are output by the unpack unit 1802 to the decoder 1820. Next the value of the counter 1810 may be updated by subtracting the code-word size from its value and the value maintained by the bit left barrel shifter 1814 may be shifted left by inserting a number of "0" 1816. The number of "0" 1816 may be equal to the size of the code-word that was just sent to the decoder. At the same time, the bit left barrel shifter 1708 may be set to maintain a value that only contains "1" values. The process of isolating code words, sending them to the decoder and updating the counter continues until the subtraction operation performed on the counter 1810 yields a negative result. At this point the value of the counter 1810 before that subtraction may be restored. Next, the unpack unit triggers the unit 1806 to send the next 64 bits. These bits might come from a memory unit or from a transmitter connected to an external device. The 64 bits 1806 received are inserted in the right part of a value maintained by the bit left barrel shifter 1804. Next, the value maintained by the bit left barrel shifter 1804 may be shifted left by inserting a number of "1" at the right. The number of "1" being equal to 128 minus the value of a counter 1810. The process of getting the next 64 bits, isolating code-words and sending them to the decoder as long as there is at least one available code word, and updating counters continues as long as the unit 1806 have available data.

Figure 19:
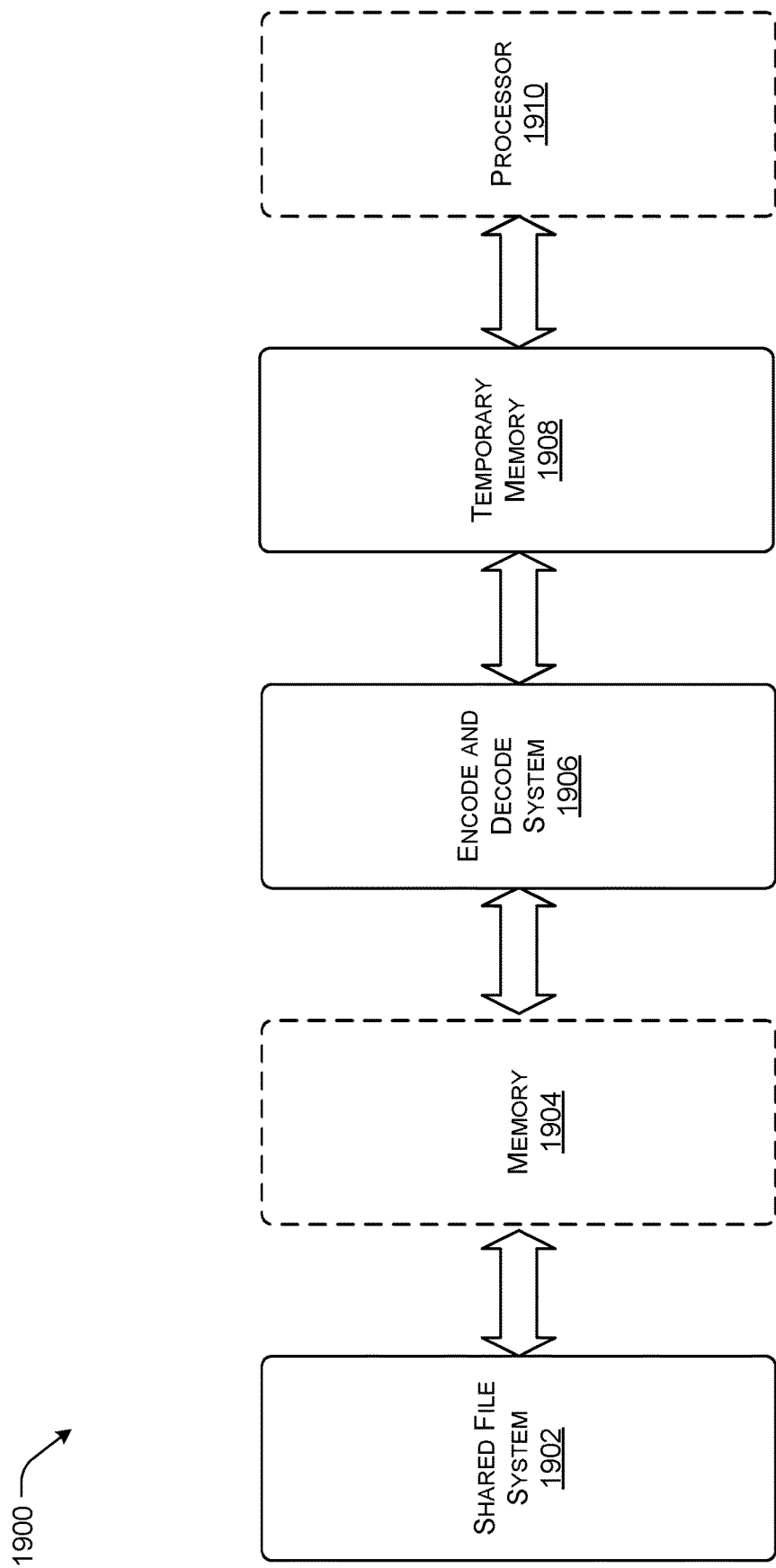
FIG. 19 illustrates a system in which data from shared-file system is encoded or decoded according to some implementations.

FIGS. 19-24 show example system that may benefit from utilizing the encoding and decoding techniques discussed above. For example, FIG. 19 illustrates a system 1900 in which data stored in a shared file system 1902 has to be processed by processor 1910. The data may be accessible by a memory 1904. The memory 1904 may be accessible by an encoding and decoding system 1906 that utilizes the systems and processes discussed above to encode and decode data (e.g., using SIGBITS, SIGBYTES, or LFLR). The system 1906 may also be able to store accessed data in a temporary memory 1908 such that a processor 1910 or other controllers may perform operations on the data. In general, an encoding and decoding system 1906 that utilizes the systems and processes discussed above to encode and decode data (e.g., using SIGBITS, SIGBYTES, or LFLR) may be placed "between" and used by various other systems or devices. Moreover, in some examples the encoding and decoding system 1906 might be integrated inside a memory controller unit that is a part of the memory 1904 sub-system.

Figure 20:
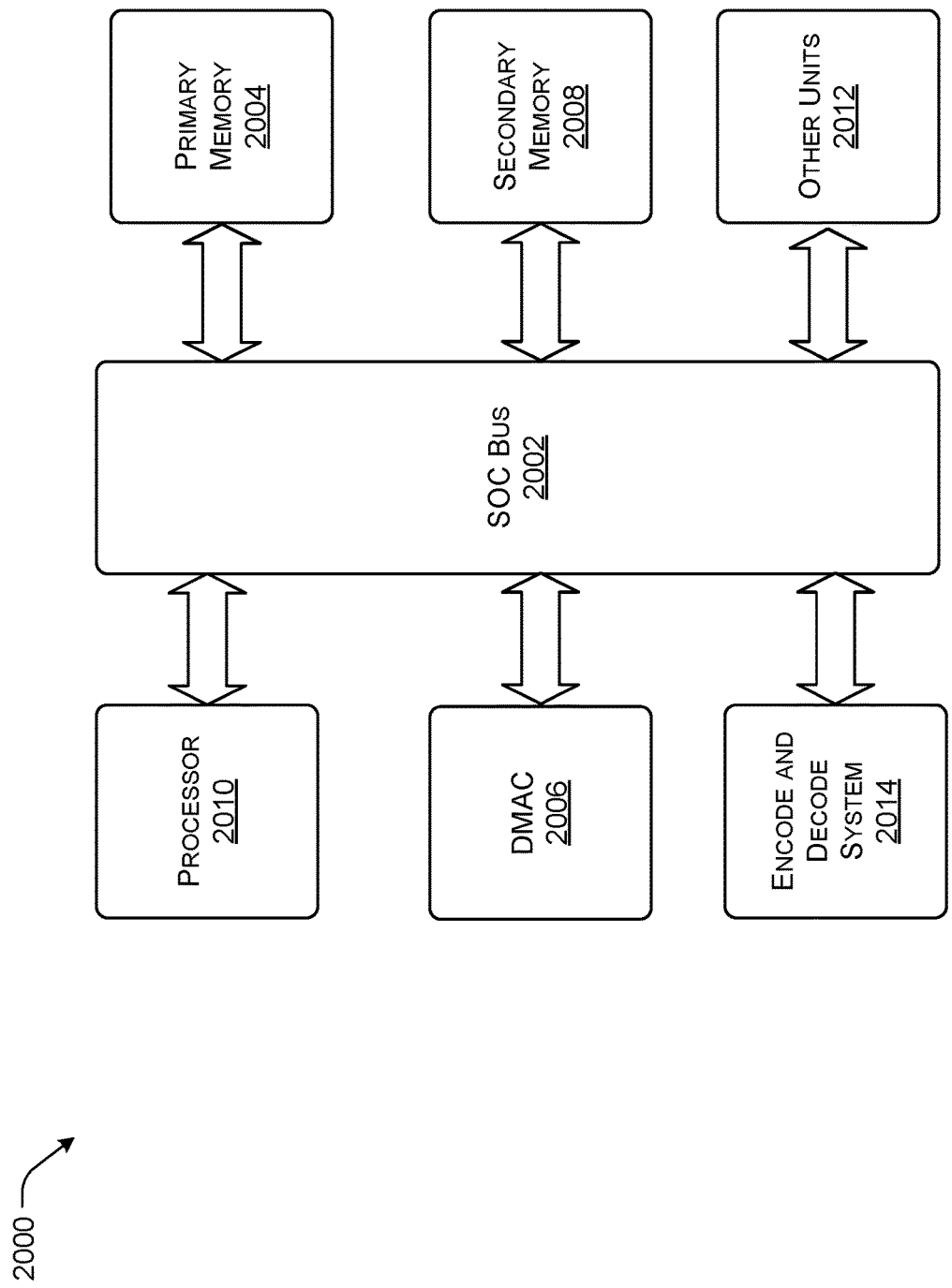
FIG. 20 illustrates an example system that includes a bus coupled to various units of the system according to some implementations.

FIG. 20 illustrates an example system 2000 that includes a system-on-chip (SOC) bus 2002 coupled to various units of the system 2000. For example, the SOC bus 2002 may allow data to be stored in an encoded or decoded format in a main (primary) memory 2004, a Direct Memory Access Controller (DMAC) 2006 or secondary memory 2008, such that the data is accessible to various SOC components such as a processor 2010 and/or other units 2012 (e.g., sensors, digital signal processors, controllers, wireless transmitters, etc.). The processor 2010 might manage the data flow in the system 2000. As the data is moved through the SOC bus 2002 it might be routed to the encoding and decoding system 2014. The encoding and decoding system 2014 may utilize the system and processes discussed above, such as SIGBITS, SIGBYTES, or LFLR, to encode and decode the data using various techniques.

Figure 21:
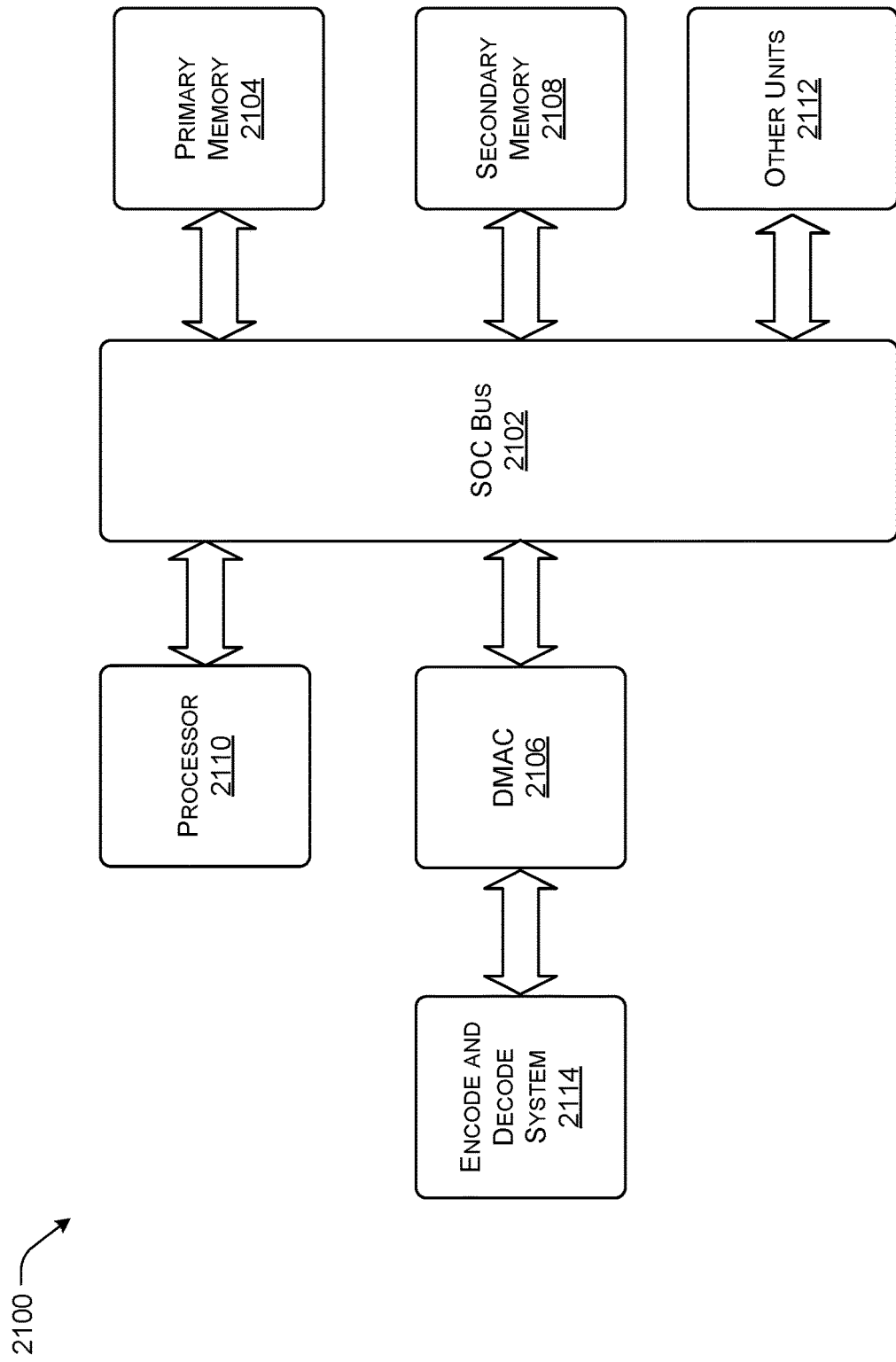
FIG. 21 illustrates yet another example system that includes a bus coupled to various units of the system according to some implementations.

FIG. 21 illustrates yet another example system 2100 that includes a SOC bus 2102 coupled to various units of the system 2100. For example, the SOC bus may allow data to be stored in an encoded or decoded format in a primary memory 2104, a DMAC 2106 or secondary memory 2108, such that the data is accessible to various components such as a processor 2110 and/or other units 2112 (e.g., sensors, digital signal processors, controllers, wireless transmitters, etc.). In this example, the system 2100 may be configured to process the encoded data and an encoding and decoding system 2114, which is not connected directly to the SOC bus may be configured to encode the data as it is received from DMAC 2016 and to decode the data as the data is output to the DMAC 2016. Alternatively, the system 2100 may be configured to process the un-encoded data and an encoding and decoding system 2114 may be configured to decode the data as it is received from the DMAC 2016 and to encode the data as the data is output to the DMAC 2016. This configuration may reduce the bus control and data transfer overhead incurred by the processor 2110. Especially, when large blocks of data have to be sent to the encoding and decoding system 2114.

Figure 22:
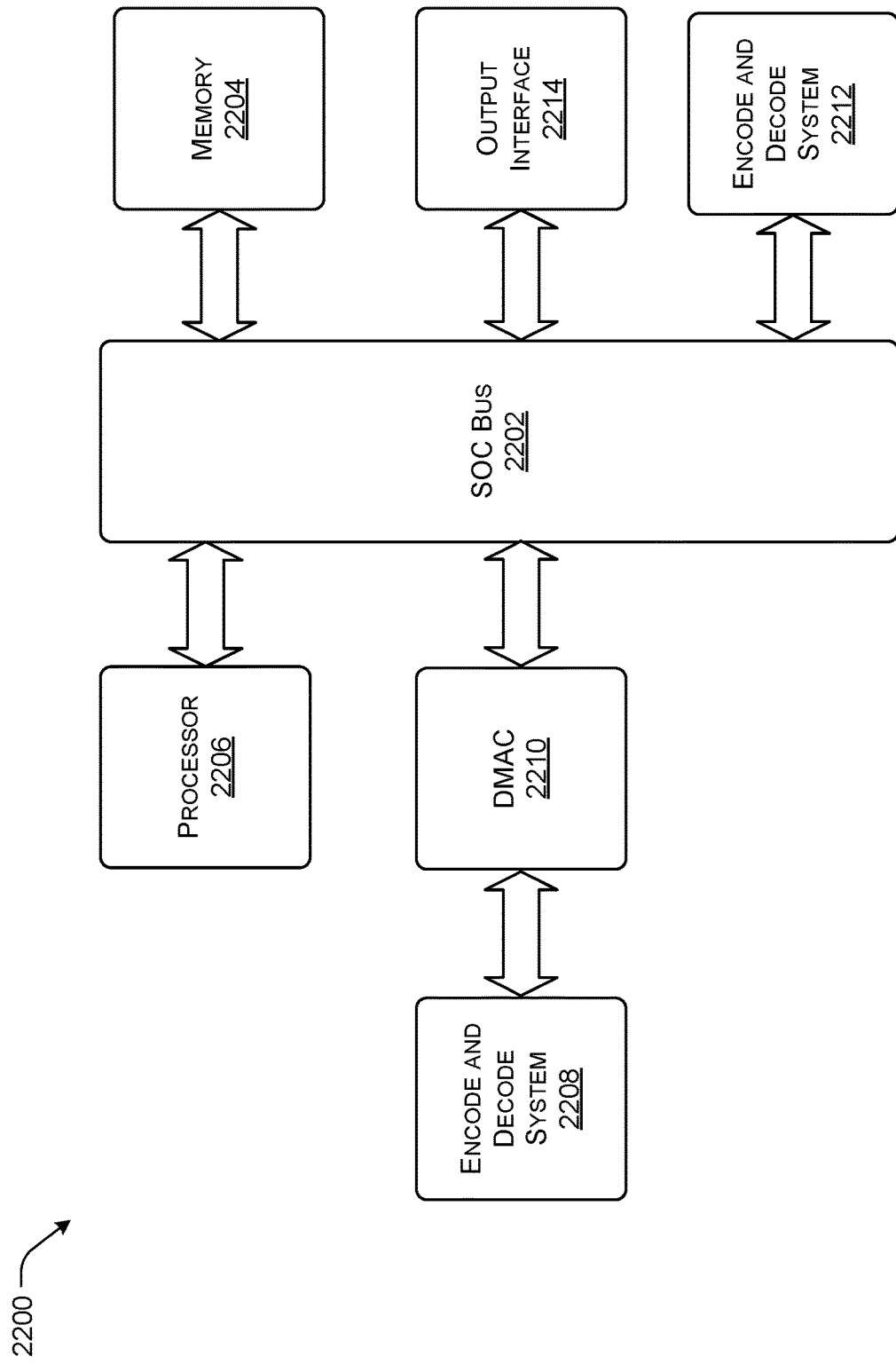
FIG. 22 illustrates yet another example system that includes a bus coupled to various units of the system according to some implementations.

FIG. 22 illustrates yet another example system 2200 that includes a SOC bus 2202 coupled to various units of the system 2200. For example, the SOC bus 2202 may allow data to be stored in an encoded format in a memory unit 2204 such that the data is accessible to various components such as a processor 2206. In this example, as data is received from a source it may be encoded by the encoding and decoding system 2208 and made available to the processor 2206. The data may also be decoded by a second encoding and decoding system 2212 prior to transmission out of the system 2200 by an interface device 2214. For example, the interface device 2214 may include one or more of a PCI express, wireless communication interface, Ethernet communication interface, other wired communication interfaces, other communication protocols, etc. In this example, the encoding and decoding systems 2208 and 2212 may utilize the system and processes discussed above to encode and decode the data using various techniques, such as SIGBITS, SIGBYTES, or LFLR. The illustration may serve as an example for systems that include a multitude of encoding and decoding systems that utilize the system and processes discussed above. Additionally, it exemplifies the way that the encoding and decoding systems 2208 and 2212 may interface with external devices using standard interface protocols such as PCI express.

Figure 23:
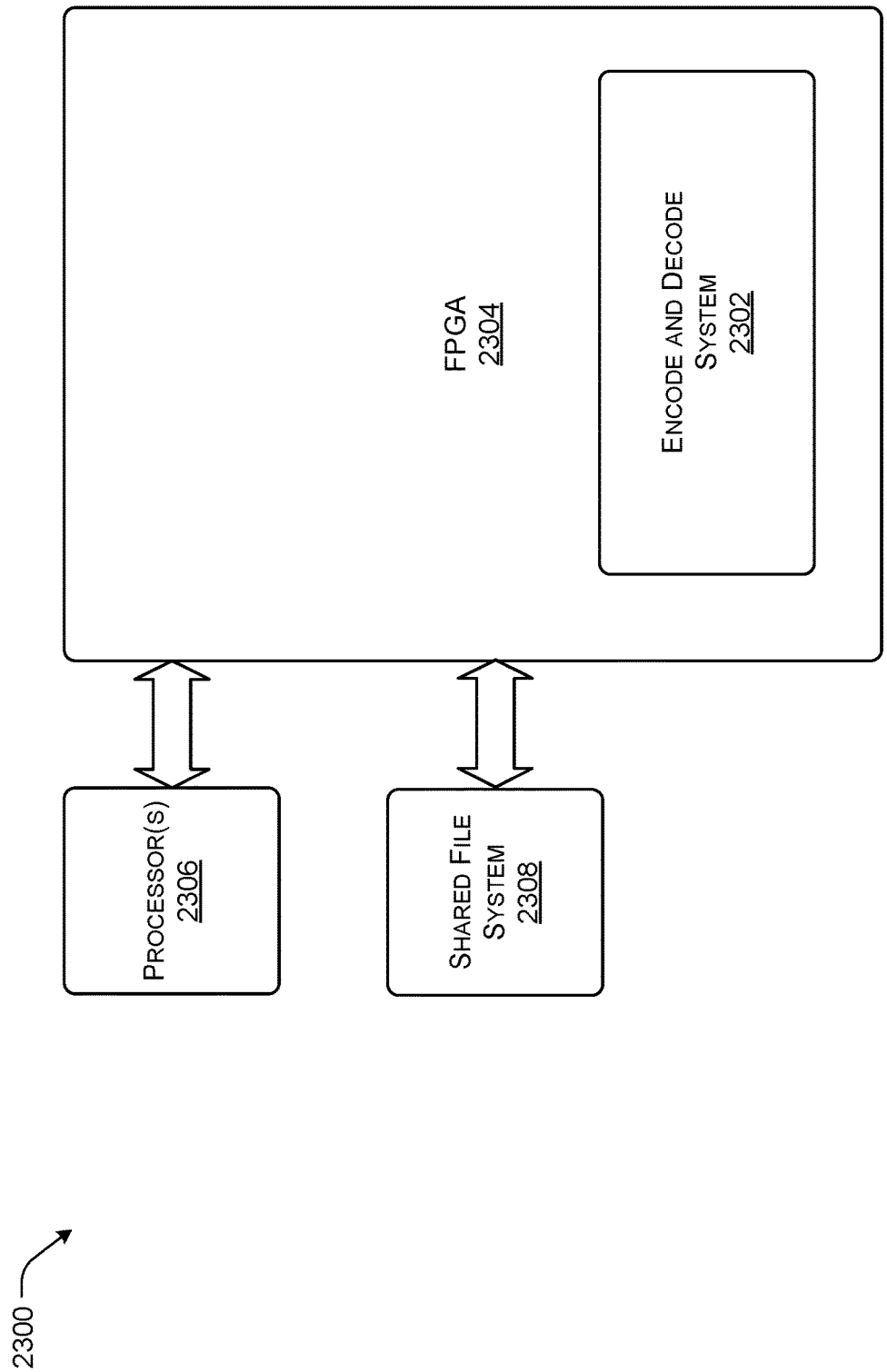
FIG. 23 illustrates an example system of an encoding and decoding system incorporated onto a field programmable gate array.

FIG. 23 illustrates an example system 2300 of an encoding and decoding system 2302 incorporated onto a field programmable gate array (FPGA) 2304. In this example, the FPGA 2304 may output data (in an encoded or decoded format) to one or more processors 2306. The FPGA 2304 may also be coupled to one or more other devices, such as the shared file system 2308. In one example, encoded data may be received at the FPGA 2304 via the shared file system 2308, decoded by the encoding and decoding system 2302 and then output to the processor 2306. Alternatively, the processor 2306 may be configured to process the encode data such that the decoded data is received at the FGPA 2304, encoded by the encoding and decoding system 2302 and then output for processing by the processor 2306. In some cases, the system 2300 may be configured such that the processors 2306 may communicate with the FGPA 2304 via special connections.

Figure 24:
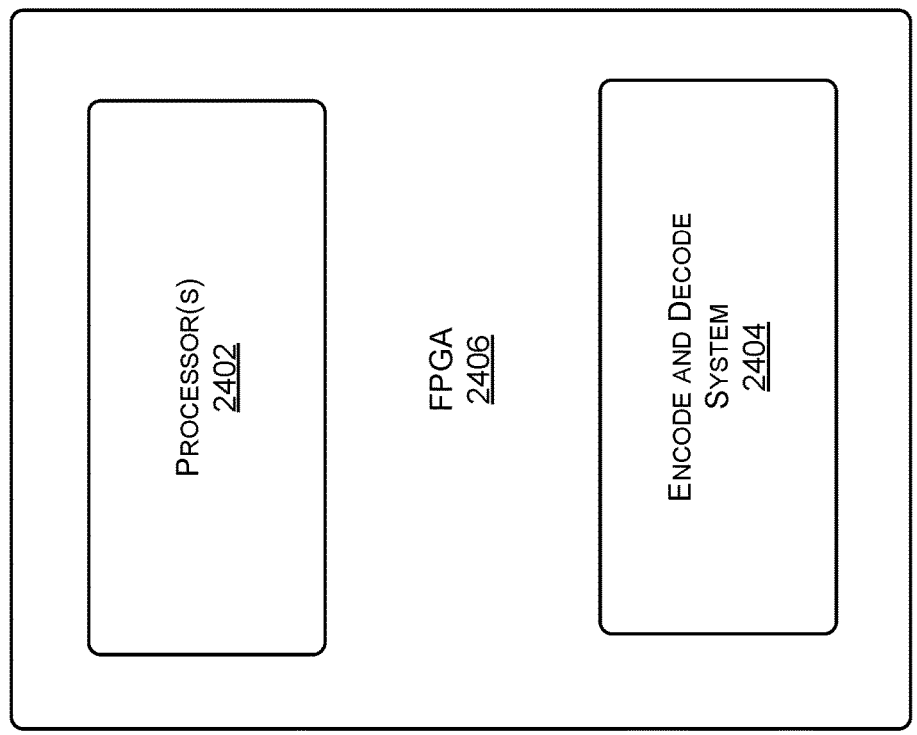
FIG. 24 illustrates another example system including a processor and an encoding and decoding system incorporated onto a field programmable gate array.

FIG. 24 illustrates another example system 2400 including a processor 2402 and an encoding and decoding system 2404 incorporated onto a field programmable gate array (FPGA) 2406. In this example, the FPGA 2406 may receive decoded data and the data may be encoded by the encoding and decoding system 2404 prior to processing by the processor 2402. Alternatively, the FPGA 2406 may receive encoded data and the data may be decoded by the encoding and decoding system 2404 prior to processing by the processor 2402.

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. A method comprising:
   receiving, by an encoding component, an integer in a binary format;
   determining a position of a leftmost bit with a value of one;
   generating a header;
   truncating zeros that are left of the leftmost bit with the value of one within the binary format to generate a frustum; and
   concatenating the frustum to the header to generate an encoded representation.

2. The method as recited in claim 1, wherein the binary format has a fixed length.

3. The method as recited in claim 1, wherein the header indicates a value equal to the position of the leftmost bit with the value of one.

4. The method as recited in claim 1, further sending the encoded representation of the integer to a second memory device.

5. The method as recited in claim 1, wherein the header is fixed length.

6. The method as recited in claim 1, further comprising truncating the leftmost bit from the binary format prior to concatenating the frustum to the header.

7. The method as recited in claim 1, further comprising concatenating at least one flag bit to the encoded representation.

8. A method comprising:
   receiving, at a decoding component, an encoded value, the encoded value representing a plurality of integers;
   shifting, by a first set of barrel shifters, individual ones of the plurality of integers right to introduce at least one leading zeros;
   shifting, by a second set of barrel shifters, at least one of the plurality of integers right to self-align the at least one of the plurality of integers; and
   outputting at least one of the individual integers of the plurality of integers.

9. The system as recited in claim 8, wherein the plurality of integers includes four integers.

10. The system as recited in claim 8, wherein a number of leading zeros for each of the individual ones of the plurality of integers determined from a fixed length header associated with the encoded value and one of the plurality of integers.

11. The system as recited in claim 8, wherein a number of barrel shifters of the first set of barrel shifters is equal to the number of integers of the plurality of integers within the encoded value.

12. A method comprising:
    receiving, at an encoding component a plurality of integers including at least a first integer and a second integer;
    shifting, by a first set of barrel shifters, individual integers of the plurality of integers to remove any leading zeros, the first set of barrel shifters including at least one barrel shifter;
    following the removal of the leading zeros, aligning each of the plurality of integers on the right of a preceding integer of the plurality of integers;
    concatenating the plurality of integers to generate a frustum; and
    outputting the encoded value including the frustum.

13. The system as recited in claim 12, wherein:
    the first set of barrel shifters includes a first barrel shifter and a second barrel shifter; and
    the shifting, by the first set of barrel shifters, includes shifting, by the first barrel shifter, the first integer left to remove any leading zeros and shifting, by the second barrel shifter, the second integer left to remove any leading zeros.

14. The system as recited in claim 12, further comprising obtained, from a first set of empty byte detectors, a plurality of headers, individual headers of the plurality of headers corresponding to individual integers of the plurality of integers.

15. The system as recited in claim 14, further comprising concatenating the frustum to the right the plurality of headers to generate the encoded value.

16. The system as recited in claim 12, wherein the plurality of integers includes a third integer and a fourth integer.

17. The system as recited in claim 16, wherein shifting, by the first set of barrel shifters, individual integers of the plurality of integers to remove any leading zeros includes:
    shifting, by a first barrel shifter, the first integer left to remove any leading zeros;
    shifting, by a second barrel shifter, the second integer left to remove any leading zeros;
    shifting, by a third barrel shifter, the second integer right to align the second integer to the left of the first integer;
    shifting, by a fourth barrel shifter, the third integer left to remove any leading zeros.

18. The system as recited in claim 16, wherein aligning each of the plurality of integers on the right of the preceding integer of the plurality of integers includes:
    shifting, by a first barrel shifter of a second set of barrel shifters, the second integer right to align the second integer to the left of the first integer;
    shifting, by a second barrel shifter of the second set of barrel shifters, the third integer right to align the second integer to the left of the second integer; and
    shifting, by a third barrel shifter of the second set of barrel shifters, the fourth integer right to align the second integer to the left of the third integer.

19. The system as recited in claim 12, wherein at least one of the plurality of integers, is empty.

20. The system as recited in claim 12, further comprising:
receiving, at a decoding component, the encoded value;
shifting, by a second set of barrel shifters, each of the plurality of integers right to reintroduce the removed leading zeros;
shifting, by a third set of barrel shifters, individual ones of the plurality of integers right to self-align the individual integers; and
outputting each of the plurality of integers.

* * * * *